(12) United States Patent
Schaedler et al.

(10) Patent No.: US 10,400,842 B1
(45) Date of Patent: Sep. 3, 2019

(54) HIERARCHICAL BRANCHED MICRO-TRUSS STRUCTURE AND METHODS OF MANUFACTURING THE SAME

(71) Applicant: HRL LABORATORIES, LLC, Malibu, CA (US)

(72) Inventors: Tobias A. Schaedler, Oak Park, CA (US); Sophia S. Yang, Los Angeles, CA (US); Jie Jiang, Sherman Oaks, CA (US); Zak C. Eckel, Calabasas, CA (US); Christopher S. Roper, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 150 days.

(21) Appl. No.: 15/650,547

(22) Filed: Jul. 14, 2017

Related U.S. Application Data

(62) Division of application No. 14/462,508, filed on Aug. 18, 2014, now Pat. No. 9,771,998.

(Continued)

(51) Int. Cl.
*G02B 6/25* (2006.01)
*G02B 6/42* (2006.01)
(Continued)

(52) U.S. Cl.
CPC .............. *F16F 7/121* (2013.01); *F16F 7/125* (2013.01); *G02B 6/02033* (2013.01);
(Continued)

(58) Field of Classification Search
CPC ............ G02B 6/12002; G02B 6/02295; G02B 6/02347; B32B 3/12; B32B 2305/024;
(Continued)

(56) References Cited

U.S. PATENT DOCUMENTS

| 3,486,278 A | 12/1969 | Woods |
| 4,575,330 A | 3/1986 | Hull |

(Continued)

OTHER PUBLICATIONS

Behler et al., "Techniques for Hierarchical Bio-Inspired Vascular Networks: Electrohydrodynamic Viscous Fingering and Electrical Treeing," Materials Engineering and Sciences Division, 11 AIChE, 3 pages, Oct. 19, 2011.

(Continued)

*Primary Examiner* — Kaveh C Kianni
*Assistant Examiner* — Hung Q Lam
(74) *Attorney, Agent, or Firm* — Lewis Roca Rothgerber Christie, LLP

(57) ABSTRACT

Branched hierarchical micro-truss structures may be incorporated into energy-absorbing structures to exhibit a tailored multi-stage buckling response to a range of different compressive loads. Branched hierarchical micro-truss structures may also be configured to function as vascular systems to deliver fluid for thermal load management or altering the aerodynamic properties of a vehicle or structure into which the branched hierarchical micro-truss structure is incorporated. The branched hierarchical micro-truss structure includes a first layer having a series of interconnected struts and a second layer having a series of struts branching outward from an end of each of the struts in the first layer.

17 Claims, 16 Drawing Sheets
(1 of 16 Drawing Sheet(s) Filed in Color)

Related U.S. Application Data

(60) Provisional application No. 61/939,694, filed on Feb. 13, 2014.

(51) Int. Cl.
| | |
|---|---|
| *G02B 6/04* | (2006.01) |
| *G02B 6/032* | (2006.01) |
| *G02B 6/10* | (2006.01) |
| *F16F 7/12* | (2006.01) |
| *G02B 6/02* | (2006.01) |
| *G03F 7/00* | (2006.01) |
| *G03F 7/30* | (2006.01) |

(52) U.S. Cl.
CPC .......... *G03F 7/0005* (2013.01); *G03F 7/0037* (2013.01); *G03F 7/30* (2013.01)

(58) Field of Classification Search
CPC . B32B 37/146; B32B 3/06; G03F 7/09; G03F 7/0037; G03F 7/0015; F16F 7/121; F16F 7/125; G06F 7/60
USPC .... 385/9, 14, 45, 46, 95, 120, 125, 129–132
See application file for complete search history.

(56) References Cited

U.S. PATENT DOCUMENTS

| | | | |
|---|---|---|---|
| 4,671,841 A | 6/1987 | Stephens | |
| 5,704,169 A | 1/1998 | Richter | |
| 6,631,231 B2 | 10/2003 | Mizuuchi et al. | |
| 6,650,817 B2 | 11/2003 | Murali | |
| 6,660,192 B1 | 12/2003 | Kim et al. | |
| 6,684,007 B2 | 1/2004 | Yoshimura et al. | |
| 6,862,393 B2 | 3/2005 | Nahshimoto | |
| 6,879,757 B1 | 4/2005 | Zhou et al. | |
| 6,898,362 B2 | 5/2005 | Forbes et al. | |
| 6,952,504 B2 | 10/2005 | Bi et al. | |
| 6,993,235 B2 | 1/2006 | Takagi et al. | |
| 7,006,747 B2 | 2/2006 | Escuti et al. | |
| 7,020,374 B2 | 3/2006 | Talin et al. | |
| 7,024,093 B2 | 4/2006 | Shelnut et al. | |
| 7,088,432 B2 | 8/2006 | Zhang | |
| 7,382,959 B1 | 6/2008 | Jacobsen | |
| 7,653,276 B1 | 1/2010 | Gross et al. | |
| 7,653,279 B1 | 1/2010 | Jacobsen | |
| 7,687,132 B1 | 3/2010 | Gross et al. | |
| 8,195,023 B1 | 6/2012 | Jacobsen et al. | |
| 8,353,240 B1 | 1/2013 | Schaedler et al. | |
| 8,573,289 B1 | 11/2013 | Roper et al. | |
| 8,671,646 B2 | 3/2014 | Zhuo et al. | |
| 8,745,958 B2 | 6/2014 | Kang et al. | |
| 9,116,428 B1 | 8/2015 | Jacobsen et al. | |
| 2004/0021237 A1 | 2/2004 | Shimizu et al. | |
| 2004/0264863 A1 | 12/2004 | Suzuki et al. | |
| 2005/0069637 A1 | 3/2005 | Bae et al. | |
| 2005/0135745 A1 | 6/2005 | Greiner et al. | |
| 2005/0287696 A1 | 12/2005 | Dumais et al. | |
| 2006/0029348 A1 | 2/2006 | Kempen et al. | |
| 2006/0172553 A1 | 8/2006 | Choi et al. | |
| 2010/0159303 A1 | 6/2010 | Rock et al. | |
| 2010/0291466 A1 | 11/2010 | Rock et al. | |
| 2010/0300669 A1 | 12/2010 | Jacobsen et al. | |
| 2012/0063131 A1 | 3/2012 | Jamar et al. | |
| 2013/0198121 A1 | 8/2013 | Modha et al. | |
| 2013/0273347 A1 | 10/2013 | Jacobsen et al. | |
| 2013/0303067 A1 | 11/2013 | Doty et al. | |
| 2014/0037873 A1 | 2/2014 | Cheung et al. | |
| 2014/0251585 A1 | 9/2014 | Kusuda et al. | |
| 2014/0272277 A1 | 9/2014 | Schaedler et al. | |
| 2014/0288650 A1 | 9/2014 | Hunt | |
| 2015/0176132 A1 | 6/2015 | Hundley et al. | |

OTHER PUBLICATIONS

Bertsch et al., "Microstereolithography: a Review," Mat. Res. Soc. Sump. Proc., 758:3-15, 2003.

Chuang et al., "A New Method to Fabricate Polymer Waveguides," Progress in Electromagnetics Research Symposium, pp. 92-95, Aug. 22-26, 2005.

Evans et al., "Concepts for enhanced energy absorption using hollow micro-lattices, " International Journal of Impact Engineering, pp. 1-13, 2010.

Gauvin et al., "Microfabrication of complex porous tissue engineering scaffolds using 3D projection stereolithography," Biomaterials, 33:3824-3834, 2012.

International Search Report and Written Opinion for International Application No. PCT/US2015/045531, dated Nov. 25, 2015, 14 pages.

Jacobsen et al., "Compression behavior of micro-scale truss structures formed from self-propagating polymer waveguides," Acta Materialia, 55:6724-6733, 2007.

Jacobsen et al., "Micro-scale Truss Structures formed from Self-Propagating Photopolymer Waveguides," Adv. Mater., 19:3892-3896, 2007.

Kagami et al., "Light-induced self-written three-dimensional optical waveguide," Applied Physics Letters, 79(8): 1079-1081, Aug. 20, 2001.

Kewitsch et al., "Nonlinear optical properties of photoresists for projection lithography," Appl. Phys. Lett., 68(4):455-457, Jan. 22, 1996.

Kithcart et al., "Heat Transfer and Skin Friction Comparison of Dimpled Versus Protrusion Roughness," Journal of Enhanced Heat Tranfer, 3(4):273-280, 1996.

Murray, "The Physiological Principle of Minimum Work. I. The Vascular System and the Cost of Blood Volume," Physiology: C. D. Murray, vol. 12, pp. 207-214, 1926.

Office action for U.S. Appl. No. 14/461,841, dated Sep. 23, 2016, 10 pages.

Pan et al., "Rapid Manufacturing in Minutes: The Development of a Mask Projection Stereolithography Process for High-Speed Fabrication," ASME, pp. 1-10, Jun. 4-8, 2012.

Shoji et al., "Optically-induced growth of fiber patterns into a photopolymerizable resin, Applied Physics Letters, Aug. 2, 1999, 737-739, vol. 75, No. 5, Department of Applied Physics, Osaka.

Sun et al., "Two-Photon Photopolymerization and 3D Lithographic Microfabrication, "APS, 170:169-273, 2004.

Thomas, "Multifunctional Poro-Vascular Composites for UAV Performance Enhancement," U.S. Naval Research Laboratory, 20 pages, Jul. 31, 2012.

U.S. Notice of Allowance for U.S. Appl. No. 14/462,501, dated Jun. 12, 2015, 5 pages.

U.S. Office Action issued in U.S. Appl. No. 14/462,501, dated Apr. 20, 2015, 8 pages.

U.S. Office Action issued in U.S. Appl. No. 14/462,501, dated Feb. 5, 2015, 10 pages.

U.S. Appl. No. 14/462,501, entitled Basal Plane Reinforced Microlattice, 50 pages.

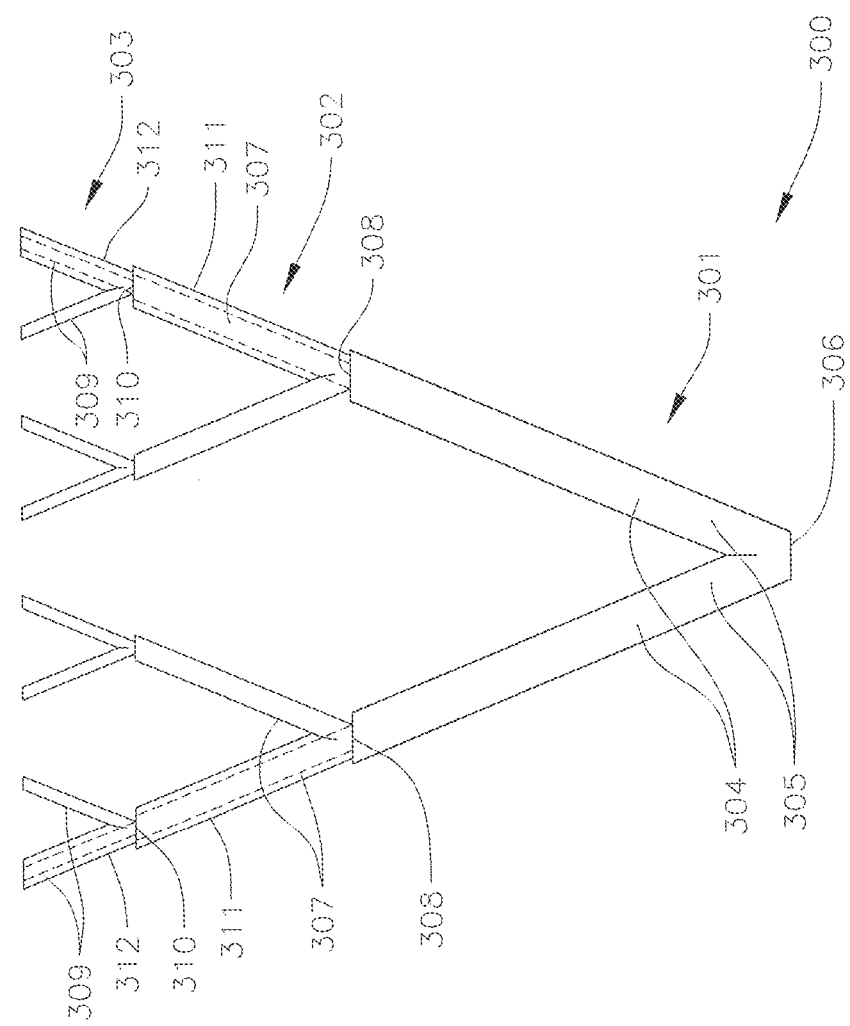

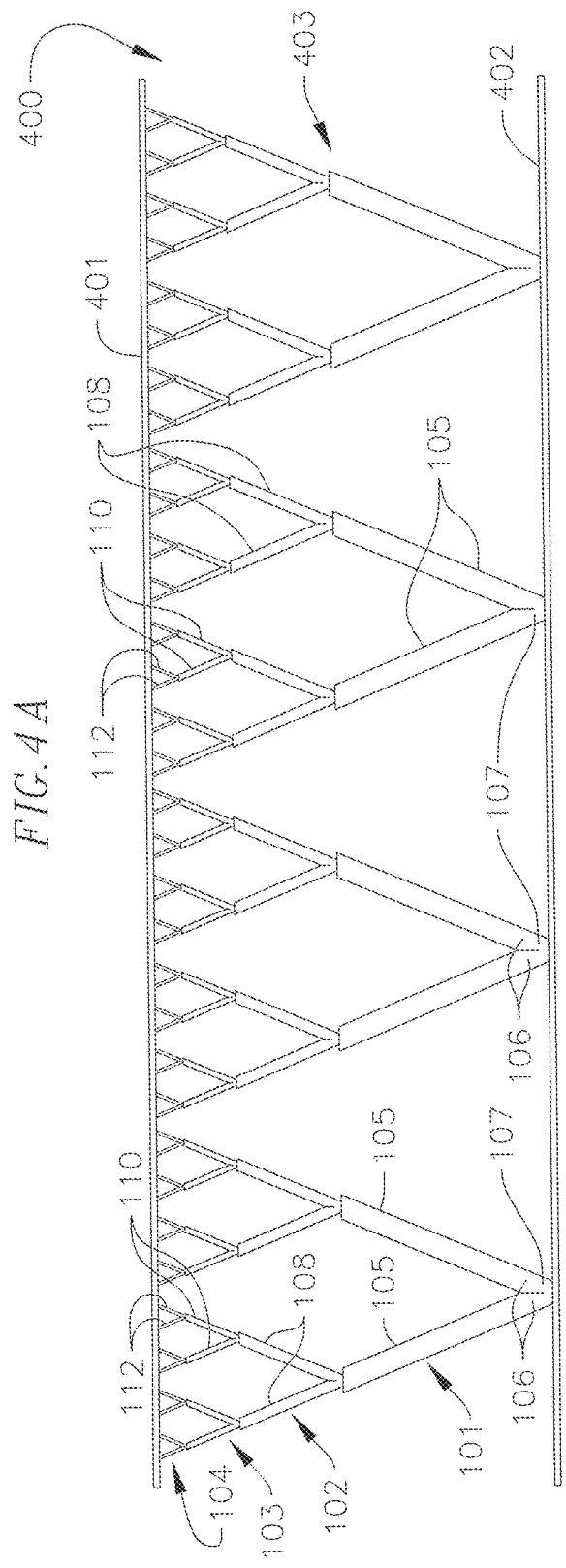

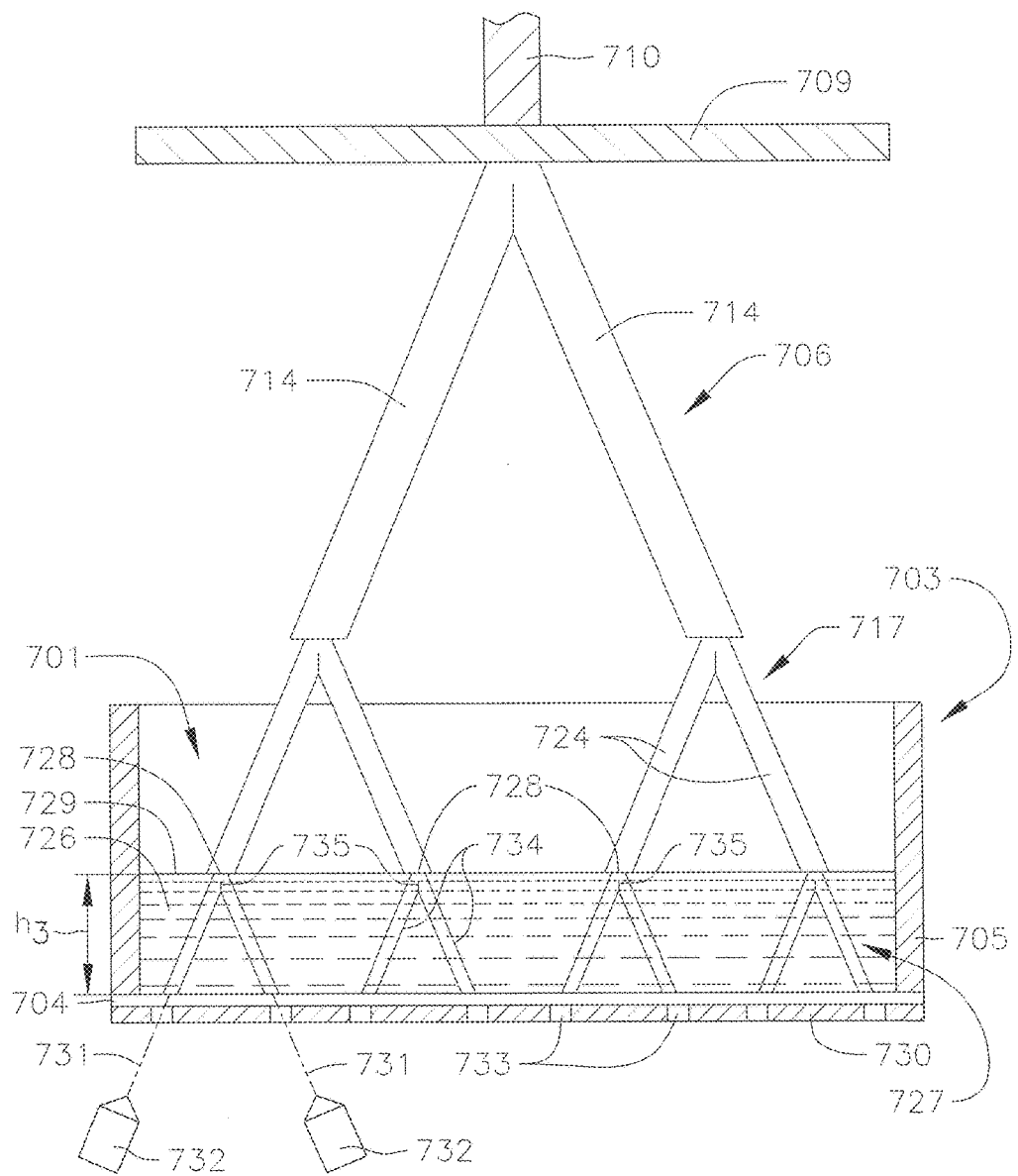

HIERARCHICAL BRANCHED MICRO-TRUSS STRUCTURE AND METHODS OF MANUFACTURING THE SAME

CROSS-REFERENCE TO RELATED APPLICATION

This application is a divisional of U.S. application Ser. No. 14/462,508, filed on Aug. 18, 2014, which claims priority to and the benefit of U.S. Provisional Application No. 61/939,694, filed Feb. 13, 2014, the entire contents of both of which are incorporated herein by reference.

BACKGROUND

Energy-absorbing structures are commonly incorporated into vehicles and other structures to protect personnel, structure, and/or property against compressive loads associated with a dynamic event, such as an impact, blast, or a crash. Related energy-absorbing structures typically include a core disposed between upper and lower facesheets coupled to the core. Typically, the core includes a closed-cell material, such as balsa wood, honeycomb, or closed-cell foam. Related energy-absorbing structures may alternately include an open-cellular core, such as a lattice core. However, related lattice cores typically include a uniform arrangement of struts. Uniform lattice cores may be structurally inefficient because the number of contact points of facesheets supported by the core cannot be increased without increasing the density of the core, which both constricts or restricts the open-cellular nature of the core and increases the overall weight of the core. Additionally, the uniform cores of related energy-absorbing structures are not configured to provide a tailored buckling response to a range of different compressive loads. To provide a customized buckling response to compressive loads, cores in related energy-absorbing structures may include several layers of different materials bonded together. However, bonding layers of dissimilar materials together is both time-consuming and cost inefficient.

Related structures may also be configured to function as a vascular system for delivering a fluid. However, related vascular systems are not configured to minimize the pressure drop of the fluid delivered through the system.

SUMMARY

Aspects of embodiments of the present disclosure are directed toward various methods of manufacturing a branched hierarchical micro-truss structure. In one embodiment, the method includes irradiating a first volume of photo-monomer with a first series of light beams to form a first layer of the micro-truss structure having a series of polymer optical waveguides coupled to a substrate. The method also includes actuating a moveable platform coupled to the substrate to lift the first layer of the micro-truss structure out of a remaining volume of photo-monomer. The method further includes irradiating a second volume of photo-monomer with the second series of light beams to form a second layer of the micro-truss structure having a series of polymer optical waveguides. The polymer optical waveguides in either the first or second layer branch outward from the polymer optical waveguides in the other layer. The method may also include adding or removing a volume of photo-monomer to the reservoir after irradiating the first volume of photo-monomer with the first series of light beams to form the first layer of the micro-truss structure. The height of the first volume of photo-monomer may be greater than a height of the second volume of photo-monomer.

The method may also include directing the first series of light beams through a series of apertures defined by a first mask, replacing the first mask with a second mask defining a series of apertures differing in size, shape, and/or spacing from the apertures defined by the first mask, and then directing the second series of light beams through the series of apertures defined by the second mask. The method may also include actuating the moveable platform to lift the first and second layers of the micro-truss structure out of a remaining volume of the photo-monomer and orienting a third series of light beams and irradiating a third volume of photo-monomer with the third series of light beams to form a third layer of the micro-truss structure having a series of polymer optical waveguides branching outward from ends of each of a series of the polymer optical waveguides in the first layer or the second layer. The method may include positioning and orienting the first series of light beams such that the polymer optical waveguides in the first layer are arranged in a square-based pyramid configuration or a tetrahedral configuration.

The method may also include coating at least a portion of the polymer optical waveguides in the first or second layer with a dissimilar material by electrodeposition, electroplating, vapor deposition, spray coating, or dip coating. The dissimilar material may be coated on a polymer optical waveguide in the first layer that is axially aligned with a polymer optical waveguide in the second layer. The method may include depositing a material to completely cover the polymer optical waveguides in the first and second layers and selectively removing the polymer optical waveguides to form a plurality of interconnected hollow tubular struts formed out of the material deposited onto the polymer optical waveguides.

The present disclosure is also directed to various embodiments of a branched hierarchical micro-truss structure. In one embodiment, the branched hierarchical micro-truss structure includes a first layer having a series of interconnected struts and a second layer having a series of struts branching outward from an end of each of a series of struts in the first layer. A diameter of the struts in the second layer may be less than a diameter of the struts in the first layer. A length of the struts in the second layer may be less than a length of the struts in the second layer. The struts of the first and second layers may be solid cylindrical rods or hollow tubes. The struts in the first layer may be arranged in a square-based pyramid configuration or a tetrahedral configuration and the struts branching out from each of the struts in the first layer may be arranged in a square-based pyramid configuration or a tetrahedral configuration. The branched hierarchical micro-truss structure may also include a third layer having a series of struts branching out from ends of each of a series of struts in the second layer. The struts in the first and second layers may be polymer optical waveguides. The branched hierarchical micro-truss structure may also include a facesheet coupled to ends of struts in an outermost one of the layers.

The present disclosure is further directed to various embodiments of a vascular system configured to deliver a fluid. The vascular systems of the present disclosure may be incorporated into a vehicle to manage thermal loading on the vehicle and/or to control the aerodynamic properties of the vehicle. In one embodiment, the vascular system includes a first layer having a series of hollow tubular struts and a second layer having a series of hollow tubular struts branching out from an end of each of a series of struts in the first layer. The hollow tubular struts in the second layer are in fluid communication with the hollow tubular struts in the first layer. The hollow tubular struts in the first layer may be arranged in a square-based pyramid configuration or a tetrahedral configuration and the hollow tubular struts in the second layer may be arranged in a square-based pyramid configuration or a tetrahedral configuration. The vascular system may also include a fluid contained in the series of hollow tubular struts in the first and second layers and a flexible membrane coupled to ends of hollow tubular struts in an outermost one of the layers. The flexible membrane is configured to form dome-shaped protrusions when a positive pressure is applied to the fluid and hemispherical dimples when a negative pressure is applied to the fluid. The vascular system may include a faceplate coupled to ends of hollow tubular struts in an outermost one of the layers. The faceplate defines a series of openings aligned with a series of openings defined by the hollow tubular struts in the outermost layer such that the fluid can be delivered through the openings defined by the faceplate. The vascular system may include a third layer having a series of hollow tubular struts branching out from an each of each of a series of struts in the second layer. The hollow tubular struts are in fluid communication with the hollow tubular struts in the second layer. The series of hollow tubular struts in the first and second layers may be polymer optical waveguides.

This summary is provided to introduce a selection of concepts that are further described below in the detailed description. This summary is not intended to identify key or essential features of the claimed subject matter, nor is it intended to be used in limiting the scope of the claimed subject matter.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale. Additionally, the patent or application file contains at least one drawing executed in color. Copies of this patent or patent application publication with color drawing(s) will be provided by the Office upon request and payment of the necessary fee.

FIGS. 3A and 3B are a perspective view and a side view, respectively, of a branched hierarchical micro-truss structure according to a further embodiment of the present disclosure;

FIGS. 4A and 4B are side views of sandwich structures having branched hierarchical micro-truss cores according to embodiments of the present disclosure;

FIGS. 9A-9C illustrate tasks of manufacturing a branched hierarchical micro-truss structure according to one embodiment of the present disclosure.

DETAILED DESCRIPTION

The present disclosure is directed to various embodiments of a branched hierarchical micro-truss structure and methods of manufacturing the branched hierarchical micro-truss structure. The branched hierarchical micro-truss structures of the present disclosure may be incorporated as a core for a load-bearing sandwich structure having a pair of facesheets coupled to the micro-truss core. The configuration of the branched hierarchical micro-truss structure is configured to improve the structural efficiency of the sandwich structure by maximizing or at least increasing the area of the facesheets that is supported by the branched hierarchical micro-truss core compared to sandwich structures incorporating conventional, non-hierarchical lattice cores. The branched hierarchical micro-truss structures of the present disclosure may also be configured to increase or maximize the energy absorption efficiency by controlling the buckling response of the branched hierarchical micro-truss structures to mitigate against large drops in crushing stress after buckling. For instance, the branched hierarchical micro-truss structures of the present disclosure may be configured to exhibit a tailored multi-stage buckling response to a range of different compressive loads. The branched hierarchical micro-truss structures of the present disclosure may be incorporated into any suitable load-bearing structure, such as, for instance, in automotive vehicles, aircraft (e.g., wings), and protective sporting gear (e.g., foot pads and helmet pads).

The branched hierarchical micro-truss structures of the present disclosure may also be configured to function as a vascular system for delivering fluid (e.g., the branched hierarchical micro-truss structures may function as a manifold for delivering a fluid). Delivering fluid through the branched hierarchical micro-truss structure may be performed to manage thermal loading (e.g., by transpirational cooling) on a vehicle or structure into which the branched hierarchical micro-truss structure is incorporated. The branched hierarchical micro-truss structures of the present disclosure may also be incorporated into an aircraft such that fluid delivery through the branched hierarchical micro-truss structures alters aerodynamic properties of the aircraft (e.g., reduces drag).

Figure 1A:
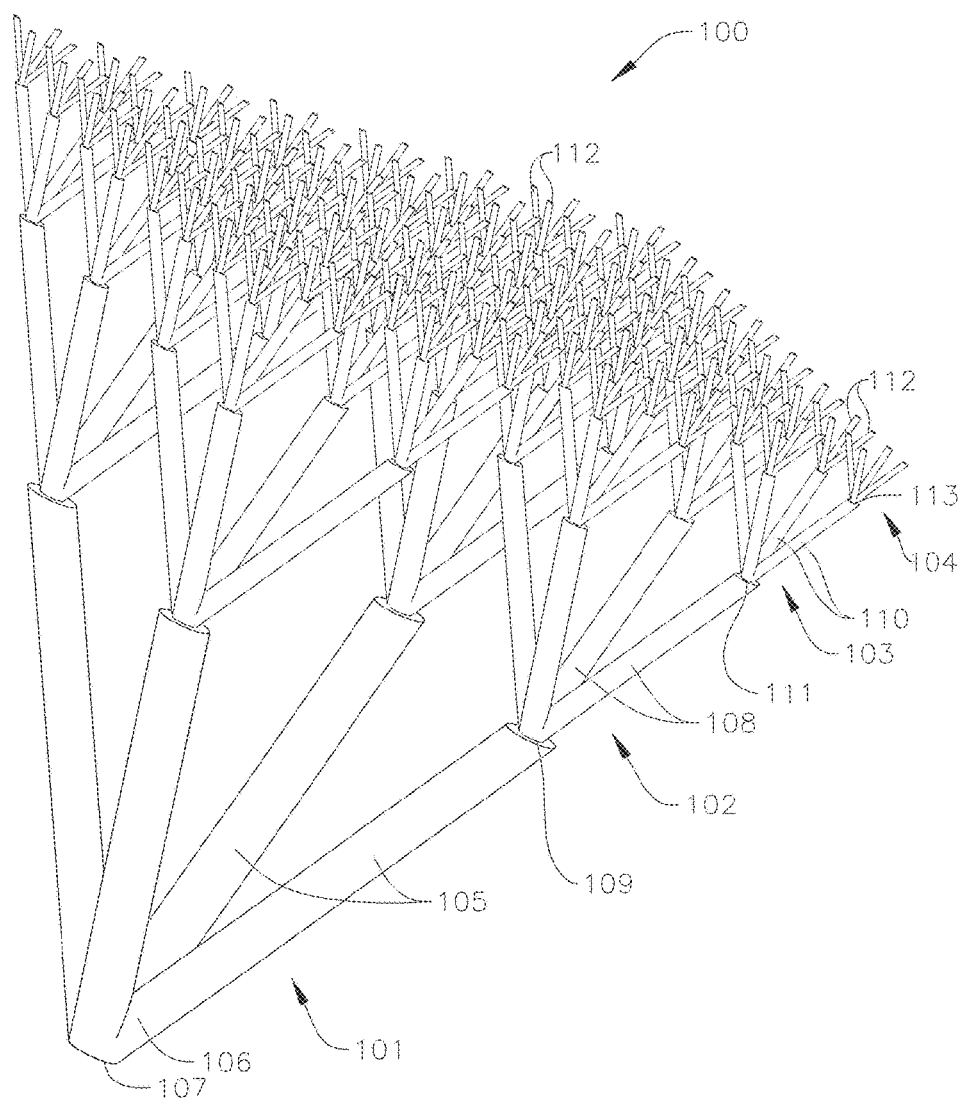
FIGS. 1A, 1B, and 1C are a perspective view, a side view, and top view, respectively, of a branched hierarchical micro-truss structure according to one embodiment of the present disclosure.
Figure 1B:
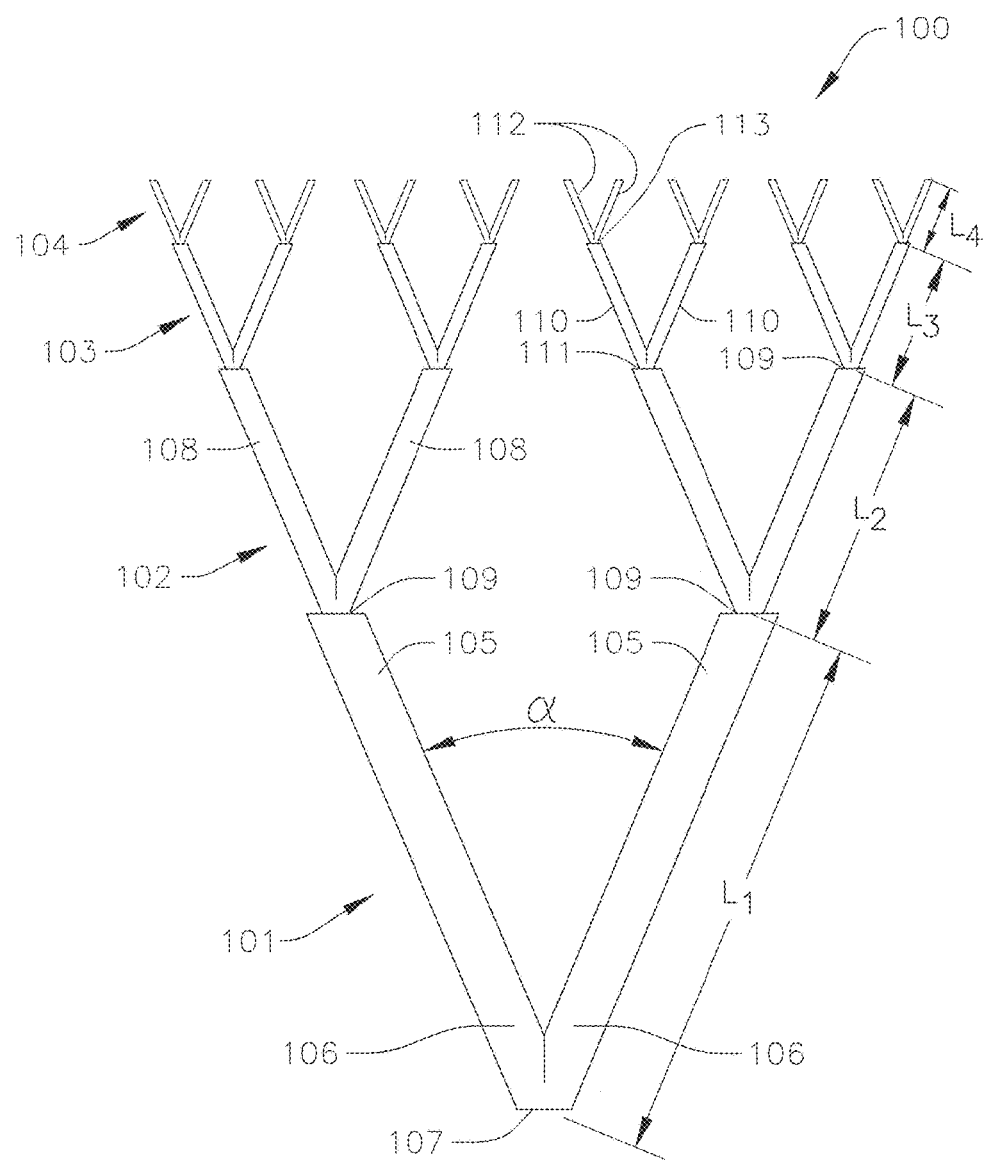
Figure 1C:
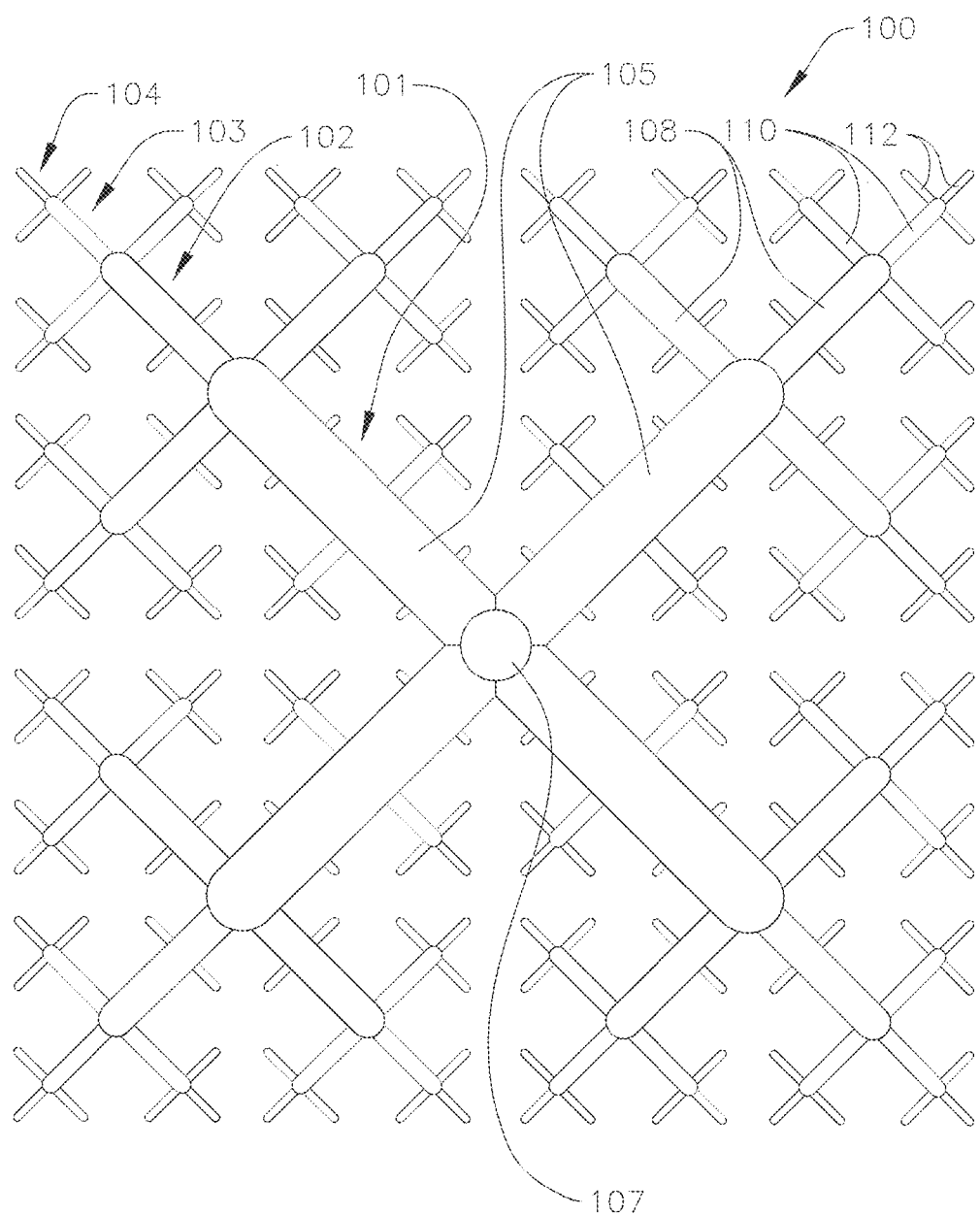

With reference now to FIGS. 1A-1C, a branched hierarchical micro-truss structure 100 according to one embodiment of the present disclosure includes four layers or levels of hierarchy 101, 102, 103, 104 stacked on top of each other. In the illustrated embodiment, the first layer 101 includes four interconnected struts or truss elements 105 arranged in an inverted square-based pyramid configuration (i.e., the struts 105 in the first layer 101 have four-fold rotational symmetry). Lower ends 106 of the struts 105 in the first layer 101 intersect or cross at a common node 107. The struts 105 in the first layer 101 also extend outward from the common node 107 at any suitable angle α, such as, for instance, from approximately or about 15 degrees to approximately or about 90 degrees. In one or more alternate embodiments, the first layer 101 of the branched hierarchical micro-truss structure 100 may include any other suitable number of struts 105, such as, for instance, from two to ten struts, and the struts 105 may be arranged in any other suitable configuration depending on the desired performance characteristics of the branched hierarchical micro-truss structure 100. For instance, in one embodiment, the lower layer 101 may include three interconnected struts arranged in a tetrahedral configuration (e.g., the lower layer 101 may include three struts having three-fold rotational symmetry).

With continued reference to the embodiment illustrated in FIGS. 1A-1C, the second layer 102 includes a plurality of interconnected struts 108 extending upward (i.e., branching out) from an upper end 109 of each of the struts 105 in the first layer 101. In the illustrated embodiment, the second layer 102 includes four struts 108 extending upward from each of the struts 105 in the first layer 101, although in one or more alternate embodiments, the second layer 102 may include any other suitable number of struts 108 branching out from the upper end 109 of each of the struts 105 in the first layer 101, such as, for instance, from one to eight struts 108. Additionally, although in the illustrated embodiment a plurality of struts 108 branch out from each of the struts 105 in the first layer 101, in one or more alternate embodiments, the struts 108 in the second layer 102 may branch out from fewer than all of the struts 105 in the first layer 101. In the illustrated embodiment, each group of four struts 108 in the second layer 102 extending upward from each of the struts 105 in the first layer 101 is arranged in an inverted square-based pyramid configuration. In one or more alternate embodiments, the struts 108 in the second layer 102 may be arranged in any other suitable configuration. For instance, in one embodiment, the second layer 102 may include groups of three struts arranged in a tetrahedral configuration branching out from each of the struts 105 in the first layer 101.

Additionally, in the embodiment illustrated in FIG. 1B, the length $L_2$ of the struts 108 in the second layer 102 is less than the length $L_1$ of the struts 105 in the first layer 101, although in one or more alternate embodiments, the struts 105, 108 in the first and second layers 101, 102 may have any other suitable relative lengths (e.g., the length $L_2$ of the struts 108 in the second layer 102 may be the same or greater than the length $L_1$ of the struts 105 in the first layer 101). In the illustrated embodiment, the length $L_2$ of the struts 108 in the second layer 102 is approximately or about 50% of the length $L_1$ of the struts 105 in the first layer 101, although in one or more alternate embodiments, the length $L_2$ of the struts 108 in the second layer 102 may be any other suitable proportion of the length $L_1$ of the struts 105 in the first layer 101, such as, for instance, from approximately or about 10% to approximately or about 100%. Additionally, in the illustrated embodiment, the diameter $D_2$ of the struts 108 in the second layer 102 is smaller than the diameter $D_1$ of the struts 105 in the first layer 101, such as, for instance, from approximately or about 5% to approximately or about 100% the diameter $D_1$ of the struts 105 in the first layer 101. In one or more alternate embodiments, the struts 105, 108 in the first and second layers 101, 102 may have any other suitable relative diameters (e.g., the diameter $D_2$ of the struts 108 in the second layer 102 may be substantially the same or greater than the diameter $D_1$ of the struts 105 in the first layer 101). Additionally, although in the illustrated embodiment the diameter $D_1$, $D_2$ of the struts 105, 108 in the first and second layers 101, 102, respectively, are uniform or substantially uniform, in one or more alternate embodiments, the diameters $D_1$, $D_2$ of the struts 105, 108 in the first layer 101 and/or the second layer 102 may vary across the respective layer (e.g., the diameters $D_1$, $D_2$ of the struts 105, 108 within a layer may be non-uniform). That is, the diameter $D_1$, $D_2$ of one or more of the struts 105, 108 in either the first layer 101 or the second layer 102 may be greater than the diameter $D_1$, $D_2$ of one or more of the other struts 105, 108 in the respective first or second layer 101, 102. For instance, in one embodiment, one or more of the struts 108, 105 may be reinforced by a coating that increases the diameter of the reinforced strut. In one or more alternate embodiments, the diameter $D_1$, $D_2$ of one or more of the struts 105, 108 in the first layer 101 and/or the second layer 102 may taper. For instance, as described in more detail below, during the process of manufacturing the branched hierarchical micro-truss structure 100, light beams are directed through a volume of photo-monomer. These light beams may tend to diverge or scatter as the light beams travel through the photo-monomer. The divergence or scattering of the light in the photo-monomer may produce struts 105, 108 that taper.

Still referring to the embodiment illustrated in FIGS. 1A-1C, the third layer 103 includes a plurality of interconnected struts 110 extending upward (i.e., branching out) from an upper end 111 of each of the struts 108 in the second layer 102, and the fourth layer 104 includes a plurality of interconnected struts 112 extending upward (i.e., branching out) from an upper end 113 of each of the struts 110 in the third layer 103. In the illustrated embodiment, the third layer 103 includes a group of four struts 110 extending upward from the upper end 111 of each of the struts 108 in the second layer 102 and the fourth layer 104 includes a group of four struts 112 extending upward for the upper end 113 of each of the struts 110 in the third layer 103, although in one or more alternate embodiments, the third and fourth layers 103, 104 may include any other suitable number of struts 110, 112 branching out from the upper ends 111, 113 of each of the struts 108, 110 in the second and third layers 102, 103, respectively, such as, for instance, from one to eight struts. Additionally, in the illustrated embodiment, the struts 110, 112 in the third and fourth layers 103, 104 are arranged in a square-based pyramid configuration, although in one or more alternate embodiments, the struts 110, 112 in the third and fourth layers 103, 104 may be arranged in any other suitable configurations, such as, for instance, in tetrahedral configurations.

Additionally, in the embodiment illustrated in FIG. 1B, a length $L_3$ of the struts 110 in the third layer 103 is less than a length $L_2$ of the struts 108 in the second layer 102 and a length $L_4$ of the struts 112 in the fourth layer 104 is less than the length $L_3$ of the struts 110 in the third layer 103. In the illustrated embodiment, the length $L_3$ of the struts 110 in the third layer 103 is approximately or about 50% of the length $L_2$ of the struts 108 in the second layer 102 and the length $L_4$ of the struts 112 in the fourth layer 104 is approximately or about 50% of the length $L_3$ of the struts 110 in the third layer 103. In one or more alternate embodiments, the length $L_3$ of the struts 110 in the third layer 103 may be any other suitable proportion of the length $L_2$ of the struts 105 in the second layer 102 and the length $L_4$ of the struts 112 in the fourth layer 104 may be any other suitable proportion of the length $L_3$ of the length of the struts 110 in the third layer 103, such as, for instance, from approximately or about 10% to approximately or about 100% of the length of the struts 105, 108 in the second and third layers 102, 103, respectively.

Additionally, in one or more alternate embodiments, the length $L_3$ of the struts 110 in the third layer 103 may be substantially the same or greater than the length $L_2$ of the struts 108 in the second layer 102 and/or the length $L_4$ of the struts 112 in the fourth layer 104 may be substantially the same or greater than the length $L_3$ of the struts 110 in the third layer 103. Additionally, in the illustrated embodiment, the diameter $D_3$ of the struts 110 in the third layer 103 is smaller than the diameter $D_2$ of the struts 108 in the second layer 102, such as, for instance, from approximately or about 5% to approximately or about 100% the diameter $D_2$ of the struts 108 in the second layer 102. In one or more alternate embodiments, the diameter $D_3$ of the struts 110 in the third layer 103 may be substantially the same or greater than the diameter $D_2$ of the struts 108 in the second layer 102 and/or the diameter $D_4$ of the struts in the fourth layer 104 may be substantially the same or greater than the diameter $D_3$ of the struts 110 in the third layer 103. Additionally, although in the illustrated embodiment the diameter $D_3$, $D_4$ of the struts 110, 112 in the third and fourth layers 103, 104, respectively, are uniform, in one or more alternate embodiments, the diameters $D_3$, $D_4$ of the struts 110, 112 in the third layer 103 and/or the fourth layer 104 may vary across the respective layer (e.g., the diameters $D_3$, $D_4$ of the struts 110, 112 within a layer may be non-uniform). For instance, in one embodiment, one or more of the struts may be reinforced by a coating that increases the diameter of the reinforced strut.

In the illustrated embodiment, the lengths $L_1$, $L_2$, $L_3$, $L_4$ and diameters $D_1$, $D_2$, $D_3$, $D_4$ of the struts 105, 108, 110, 112 decrease with each successive layer from the first layer 101 to the fourth layer 104. Accordingly, in the illustrated embodiment, the first layer 101 functions as relatively strong primary struts or stems 105 supporting a plurality of relatively weaker and smaller secondary struts or branches 108 in the second layer 102, a plurality of even weaker and smaller tertiary struts or branches 110 in the third layer 103, and a plurality of relatively weakest and smallest quaternary struts or branches 112 in the fourth layer 104. Therefore, in one embodiment, the fourth layer 104 is configured to buckle in response to relatively weak loads exceeding a lower threshold, the third layer 103 is configured to buckle in response to loads exceeding an intermediate threshold that is higher than the lower threshold, the second layer 102 is configured to buckle in response to relatively higher loads exceeding the intermediate threshold, and the first layer 101 is configured to buckle is response to relatively higher loads. In this manner, the branched hierarchical micro-truss structure 100 may be configured to exhibit a tailored buckling response to a range of different compressive loads. It will be appreciated that the configurations, materials, lengths, and diameters of the struts 105, 108, 110, 112 in the first, second, third, and fourth layers 101, 102, 103, 104 may be selected based on the desired performance characteristics of the branched hierarchical micro-truss structure 100 (e.g., the thresholds at which the first, second, third, and fourth layers 101, 102, 103, 104 are configured to buckle).

Additionally, in the illustrated embodiment, the number of struts branching out from the upper end of each of the struts in the lower layer is constant or uniform throughout the branched hierarchical micro-truss structure 100. For instance, in the illustrated embodiment, the number of struts 112 in the fourth layer 104 branching out from the upper end 113 of each of the struts 110 in the third layer 103 (e.g., four) is equal to the number of struts 110 in the third layer 103 branching out from the upper end 111 of each of struts 108 in the second layer 102 and the number of struts 108 in the second layer 102 branching out from the upper end 109 of each of the struts 105 in the first layer 101. In one or more alternate embodiments, the number of struts branching out from the upper end of each of the struts may vary across the layers 102, 103, 104 and/or may vary within one or more of the layers 102, 103, 104 depending on the desired performance characteristics of the branched hierarchical micro-truss structure 100.

Additionally, in one embodiment, the orientation of the struts branching out from the upper end of each of the struts in the lower layer is constant throughout the branched hierarchical micro-truss structure 100. For instance, in one embodiment, the struts 112 in the fourth layer 104 branching out from the upper end 113 of each of the struts 110 in the third layer 103 have the same orientation as the struts 110 in the third layer 103 branching out from the upper end 111 of each of the struts 108 in the second layer 102 and the same orientation as the struts 108 in the second layer 102 branching out from the upper end 109 of each of the struts 105 in the first layer 101. In one or more alternate embodiments, the orientation of the struts 108, 110, 112 may vary across the layers 102, 103, 104 and/or may vary within one or more of the layers 102, 103, 104 depending on the desired performance characteristics of the branched hierarchical micro-truss structure 100.

Additionally, in the embodiment illustrated in FIGS. 1A and 1B, each of the struts 105 in the first layer 101 is axially aligned with one strut 108, 110, 112 in each of the second, third, and fourth layers 102, 103, 104 (i.e., the branched hierarchical micro-truss structure 100 includes four sets of struts axially aligned through the first, second, third, and fourth layers 101, 102, 103, 104). Aligning the struts provides an efficient, direct load path through which compressive loads applied to the branched hierarchical micro-truss structure 100 may pass from one end of the branched hierarchical micro-truss structure 100 to the other end of the branched hierarchical micro-truss structure 100 (i.e., axially aligning the struts increases the efficiency of the branched hierarchical micro-truss structure 100 in transmitting loads from one end of the micro-truss structure 100 to an opposite end of the micro-truss structure 100).

In the embodiment illustrated in FIG. 1A-1C, the struts 105, 108, 110, 112 in the first, second, third, and fourth layers 101, 102, 103, 104, respectively, are solid, cylindrical rods. In one or more alternate embodiments, the struts 105, 108, 110, 112 may be hollow, cylindrical tubes. Additionally, in one or more alternate embodiments, the struts 105, 108, 110, 112 may have any other desired cross-sectional shape, such as, for instance, oval, polygonal (e.g., triangular, pentagonal, hexagonal, star-shaped), or irregularly shaped, suitable for the intended application of the branched hierarchical micro-truss structure 100 and the desired performance characteristics of the branched hierarchical micro-truss structure 100.

Although in the illustrated embodiment of FIGS. 1A-1C, the branched hierarchical micro-truss structure 100 includes four layers 101, 102, 103, 104, in one or more alternate embodiments, the branched hierarchical micro-truss structure 100 may include any other suitable number of layers 101, 102, 103, 104, such as, for instance, from two to eight layers, depending on the intended application of the branched hierarchical micro-truss structure 100 and the desired performance characteristics (e.g., the buckling response, energy absorption properties, and load-bearing capacity) of the branched hierarchical micro-truss structure 100. Additionally, the branched hierarchical micro-truss structure 100 illustrated in FIGS. 1A-1C may be mirrored about a horizontal plane to form a branched hierarchical micro-truss structure having eight layers (i.e., eight levels of hierarchy). Further, the branched hierarchical micro-truss structure 100 may be repeated into an array of branched hierarchical micro-truss structures 100.

The struts 105, 108, 110, 112 may be made out of any material suitable for the intended application of the branched hierarchical micro-truss structure 100 and the desired performance characteristics of the branched hierarchical micro-truss structure 100, such as, for instance, polymer, metal, metal alloy, ceramic, or any combination thereof.

Figure 2A:
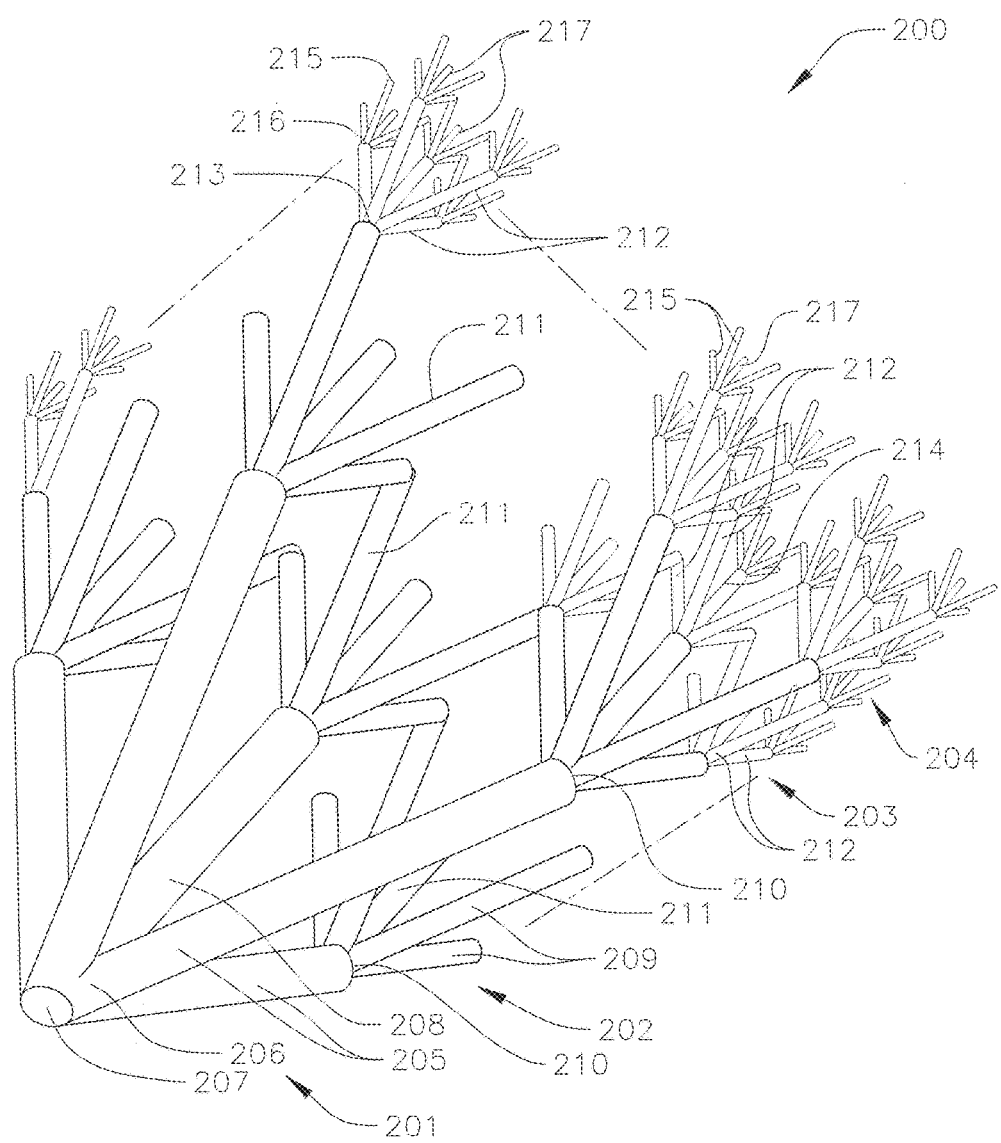
FIGS. 2A and 2B are a perspective view and a side view, respectively, of a branched hierarchical micro-truss structure according to another embodiment of the present disclosure.
Figure 2B:
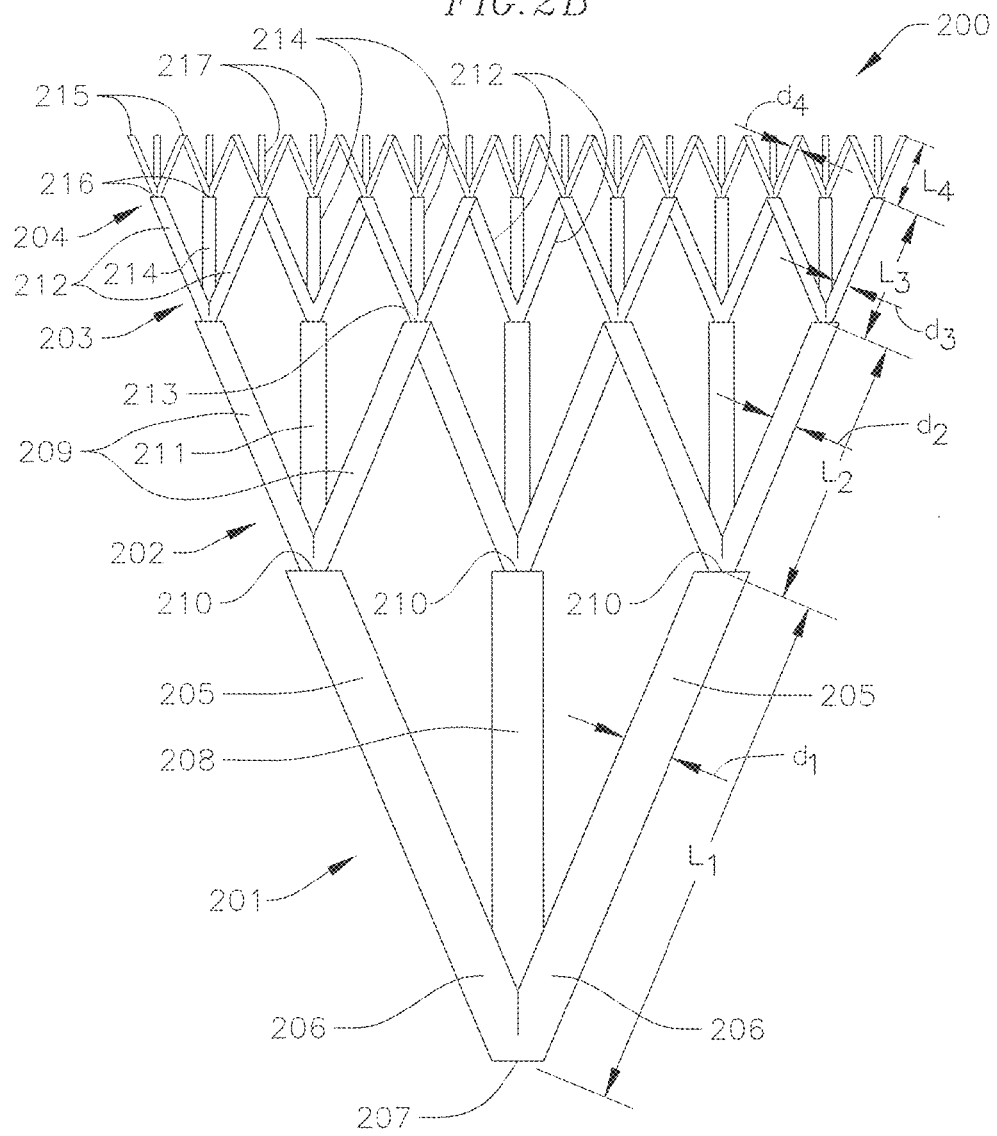

With reference now to FIGS. 2A-2B, a branched hierarchical micro-truss structure 200 according to another embodiment of the present disclosure is illustrated. In the illustrated embodiment, the branched hierarchical micro-truss structure 200 includes four layers 201, 202, 203, 204 stacked on top of each other. The first layer 201 includes four interconnected struts or truss elements 205 arranged in an inverted square-based pyramid configuration (i.e., the struts 205 in the first layer 201 have four-fold rotational symmetry). Lower ends 206 of the struts 205 in the first layer 201 intersect at a common node 207. The first layer 201 also includes a central, vertical strut 208 extending upward from the common node 207. In the illustrated embodiment, the four struts 205 in the first layer 201 that are arranged in the square-based pyramid configuration are rotationally symmetric about the central, vertical strut 208.

With continued reference to FIGS. 2A-2B, the second layer 202 includes four interconnected struts 209 arranged in an inverted square-based pyramid configuration extending upward (i.e., branching out) from an upper end 210 of each of the struts 205, 208 in the first layer 201 and a central, vertical strut 211 extending upward from the upper end 210 of each of the struts 205, 208 in the first layer 201. Additionally, in the illustrated embodiment, the struts 209, 211 in the second layer 202 have the same orientation as the struts 205, 208 in the first layer 201, although in one or more alternate embodiments, the struts 209, 211 in the second layer 202 may have a different orientation than the struts 205, 208 in the first layer 201. Additionally, in the illustrated embodiment, the number of struts 209, 211 extending upward from each of the struts 205, 208 in the first layer 201 is equal to the number of struts 205, 208 in the first layer 201. In one or more alternate embodiments, the number of struts 209, 211 extending upward from the upper end 210 of each of the struts 205, 208 in the first layer 201 may be different than the number of struts 205, 208 in the first layer 201.

The third layer 203 of the branched hierarchical micro-truss structure 200 includes four interconnected struts 212 arranged in an inverted square-based pyramid configuration extending upward from an upper end 213 of each of the struts 209, 211 in the second layer 202 and a central, vertical strut 214 extending upward from the upper end 213 of each of the struts 209, 211 in the second layer 202. Similarly, the fourth layer 204 of the branched hierarchical micro-truss structure 200 includes four interconnected struts 215 arranged in an inverted square-based pyramid configuration extending upward from an upper end 216 of each of the struts 212, 214 in the third layer 202 and a central, vertical strut 217 extending upward from the upper end 216 of each of the struts 212, 214 in the third layer 203. In the illustrated embodiment, the struts 212, 214 and 215, 217 in the third and fourth layers 203, 204, respectively, have the same orientation as the struts 209, 211 in the second layer 202. In one or more alternate embodiments, the branched hierarchical micro-truss structure 200 may have any other suitable number of layers 201, 202, 203, 204, such as, for instance, from two to eight layers, depending on the intended application of the branched hierarchical micro-truss structure 200 and the desired performance characteristics of the branched hierarchical micro-truss structure 200. Additionally, in the illustrated embodiment, lengths $l_1$, $l_2$, $l_3$, $l_4$ and diameters $d_1$, $d_2$, $d_3$, $d_4$ of the struts in the first, second, third, and fourth layers 201, 202, 203, 204, respectively, decrease between successive layers. In one or more alternate embodiments, the struts may have any other suitable relative lengths $l_1$, $l_2$, $l_3$, $l_4$ and relative diameters $d_1$, $d_2$, $d_3$, $d_4$. Additionally, although in the illustrated embodiment the diameters $d_1$, $d_2$, $d_3$, $d_4$ of the struts are constant or uniform within their respective layers, in one or more alternate embodiments, the diameters $d_1$, $d_2$, $d_3$, $d_4$ of the struts may vary across their respective layers, such as, for instance, due to a reinforcing coating applied to one or more of the struts.

In one embodiment, the branched hierarchical micro-truss structure 200 may be the same or similar to the branched hierarchical micro-truss structure 100 described above with the addition of central, vertical struts 208, 211, 214, 217 in each of the layers 201, 202, 203, 204.

Figure 3A:
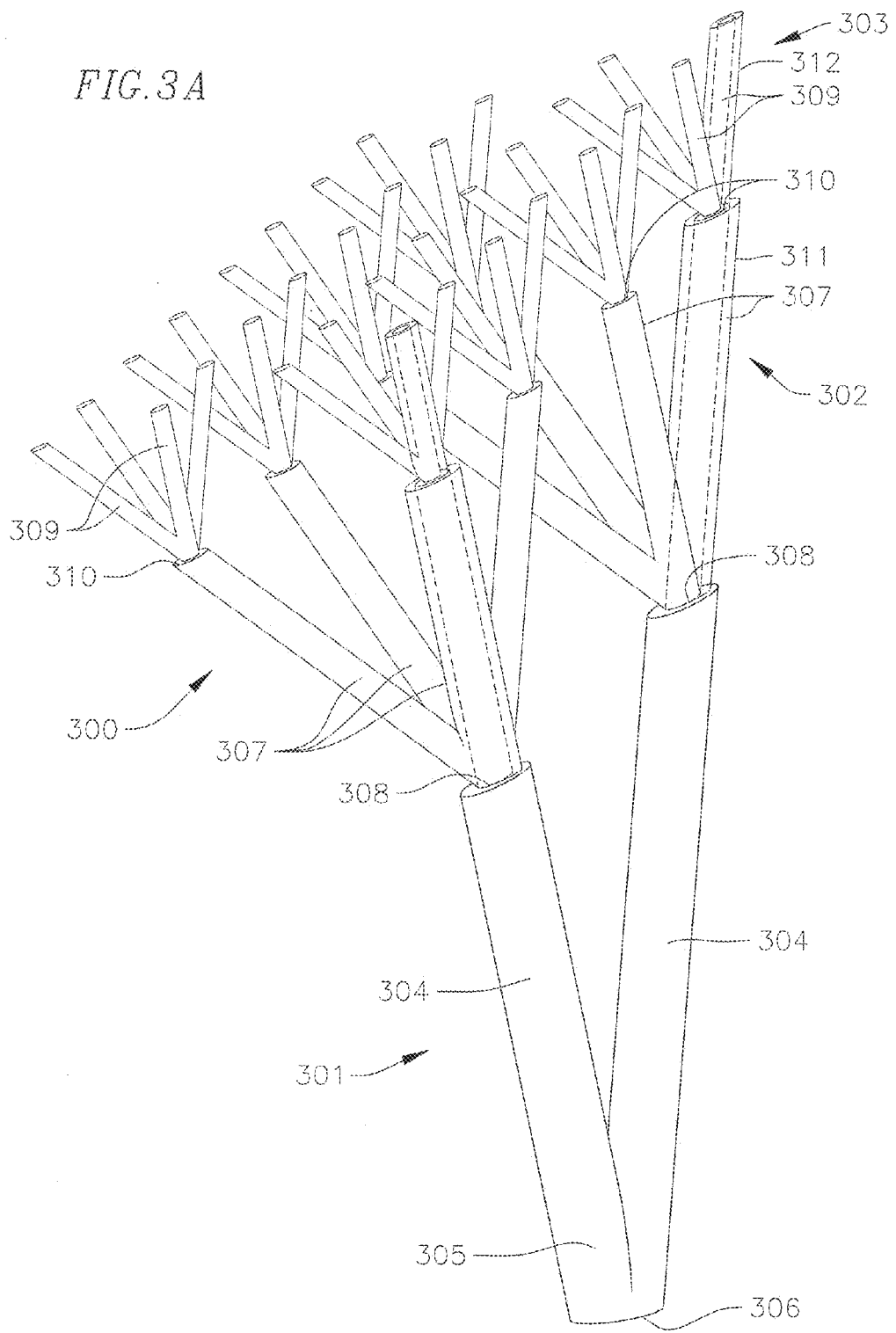

With reference now to FIGS. 3A and 3B, a branched hierarchical micro-truss structure 300 according to another embodiment of the present disclosure includes three layers 301, 302, 303 stacked on top of each other, although in one or more alternate embodiments, the branched hierarchical micro-truss structure 300 may have any other desired number of layers suitable for the intended application of the branched hierarchical micro-truss structure 300. In the illustrated embodiment, the first layer 301 includes three interconnected struts or truss elements 304 arranged in a tetrahedral configuration (i.e., the struts 304 in the first layer 301 have three-fold rotational symmetry). Lower ends 305 of the struts 304 in the first layer 301 intersect or cross at a common node 306. In one or more alternate embodiments, the first layer 301 may have any other suitable number of struts 304 and the struts 304 may be arranged in any other suitable configuration. Additionally, in the illustrated embodiment, the second layer 302 includes three struts 307 arranged in a tetrahedral configuration extending upward (i.e., branching out) from an upper end 308 of each of the struts 304 in the first layer 301 and the third layer 303 includes three struts 309 arranged in a tetrahedral configuration branching out from an upper end 310 of each of the struts 307 in the second layer 302. In one or more alternate embodiments, the second and third layers 302, 303 may include any other suitable number of struts 307, 309 branching out from the upper ends 308, 310 of the struts 304, 307 in the first and second layers 301, 302, respectively, and the struts 307, 309 in the second and third layers 302, 303 may be arranged in any other suitable configurations. Additionally, the orientation of the struts 307, 309 may vary across the layers 302, 303 and/or may vary within one or more of the layers 302, 303 depending on the desired performance characteristics of the branched hierarchical micro-truss structure 300.

Additionally, in the embodiment illustrated in FIGS. 3A and 3B, each of the struts 304 in the first layer 301 is axially aligned with one of the struts 307 in the second layer 302 and one of the struts 309 in the third layer 303 (i.e., the branched hierarchical micro-truss structure 300 includes three sets of struts axially aligned through the first, second, and third layers 301, 302, 303). As described above, aligning the struts provides an efficient, direct load path through which compressive loads applied to the branched hierarchical micro-truss structure 300 may pass from one end of the branched hierarchical micro-truss structure 300 to the other end of the branched hierarchical micro-truss structure 300. Additionally, in the embodiment illustrated in FIGS. 3A and 3B, the struts 307, 309 in the second and third layers 302, 303 that are axially aligned with the struts 304 in the first layer 301 are each selectively reinforced with a coating 311, 312, respectively. The coatings 311, 312 may be applied by any suitable process, such as, for instance, electrodeposition, electroplating, vapor deposition (e.g., chemical vapor deposition (CVD)), spray coating, dip coating, or any combination thereof. The coatings 311, 312 may be formed from any suitable material, such as, for instance, metal (e.g., nickel, aluminum), metal alloy (e.g., nickel-phosphorous alloy), ceramic, polymer (e.g., poly(p-xylylene)), or any combination thereof. In one or more alternate embodiments, one or more of the struts 307, 309 in the second or third layers 302, 303 that are not aligned with the struts 304 in the first layer 301 may also be coated and/or one or more of the struts 304 in the first layer 301 may be coated.

Figure 5A:
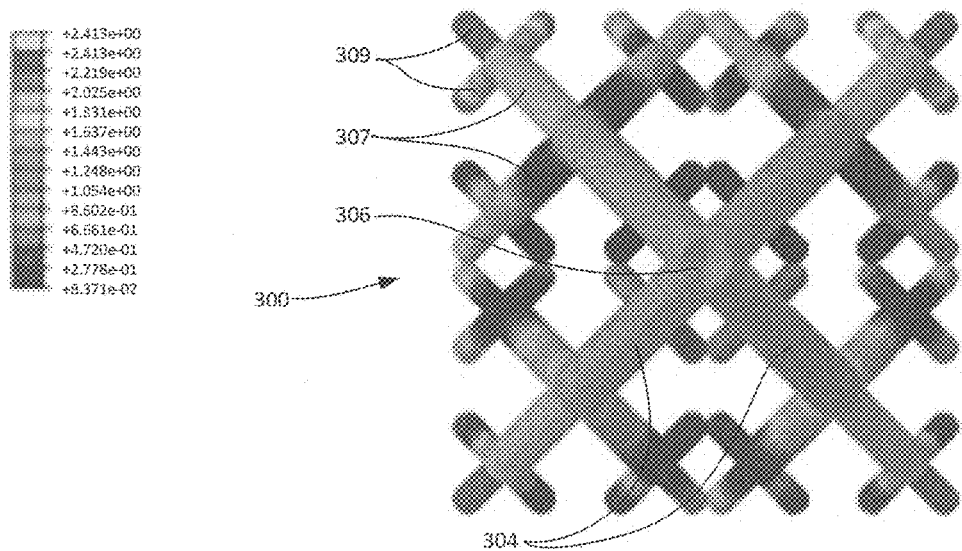
FIGS. 5A and 5B illustrate the stresses experienced by embodiments of the branched hierarchical micro-truss structures of the present disclosure when subject to loading.
Figure 5B:
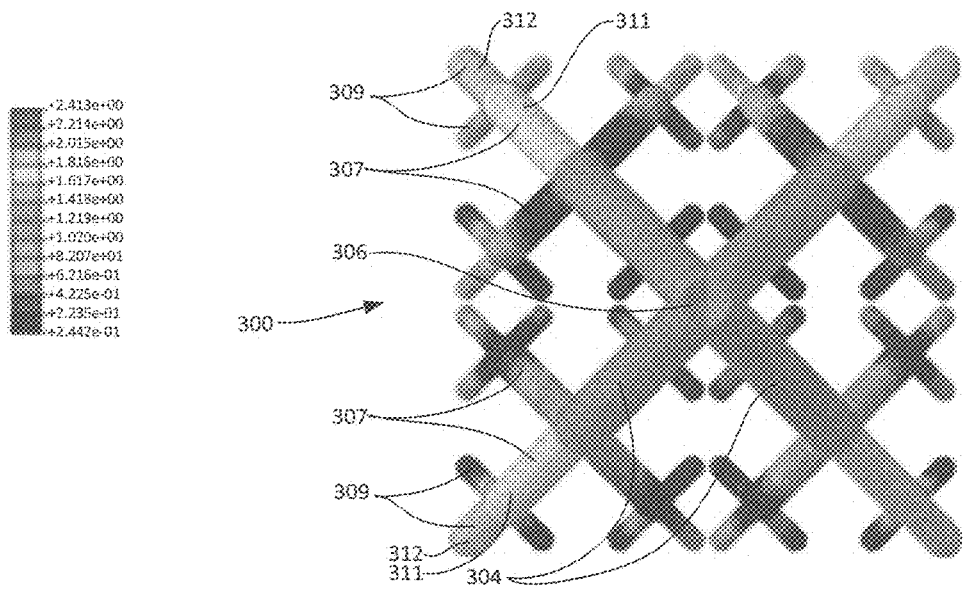

FIG. 5A illustrates the Von Mises stresses developed in a branched hierarchical micro-truss structure similar to the branched hierarchical micro-truss structure 300 of FIGS. 3A and 3B, but without the reinforcing coatings 311, 312 on the struts 307, 309. As illustrated in FIG. 5A, the struts 307, 309 in the second and third layers 302, 303 that are axially aligned with the struts 304 in the first layer 301 develop higher stresses than the struts 307, 309 in the second and third layers 302, 303 that are not axially aligned with the struts 304 in the first layer 301. In the illustrated embodiment, the struts 309 in the third layer 303 that are aligned with the struts 304 in the first layer 301 experienced a stress of approximately or about 2.413 MPa (shown in red) and the struts 307 in the second layer 302 that are aligned with the struts 304 in the first layer 301 experienced a stress of approximately or about 1.637 MPa (shown in yellowish green). FIG. 5B illustrates the Von Mises stresses developed in the branched hierarchical micro-truss structure 300 of FIGS. 3A and 3B (i.e., with the reinforcing coatings 311, 312 on the struts 307, 309 in the second and third layers 302, 303 that are axially aligned with the struts 304 in the first layer 301). In the illustrated embodiment, the struts 309 in the third layer 303 that are axially aligned with the struts 304 in the first layer 301 experienced a stress of approximately or about 2.025 MPa (shown in orange) and the struts 307 in the second layer 302 that are aligned with the struts 304 in the first layer 301 experienced a stress of approximately or about 1.831 MPa (shown in yellow). Accordingly, the reinforcing coating 312 applied to the struts 309 in the third layer 303 that are axially aligned with the struts 304 in the first layer 301 reduces the stresses from approximately or about 2.413 MPa to approximately or about 2.025 MPa. Thus, in one embodiment, the reinforcing coatings 311, 312 are configured to prevent the local failure of the reinforced struts 307, 309 and thereby enhance the overall strength of the branched hierarchical micro-truss structure 300.

Additionally, in one embodiment, the branched hierarchical micro-truss structure 300 illustrated in FIGS. 3A and 3B (i.e., the branched hierarchical micro-truss structure 300 with three layers of struts 301, 302, 303 arranged in tetrahedral configurations and with reinforcing coatings 311, 312 on the struts 307, 309 in the second and third layers 302, 303 that are axially aligned with the struts 304 in the first layer 301) is approximately 30% stronger than a conventional lattice structure having a uniform arrangement of struts. That is, in one embodiment, the branched hierarchical micro-truss structure 300 illustrated in FIGS. 3A and 3B is configured to bear approximately 30% higher compressive loads before buckling failure than a conventional lattice structure having two full unit cells.

Figure 4B:
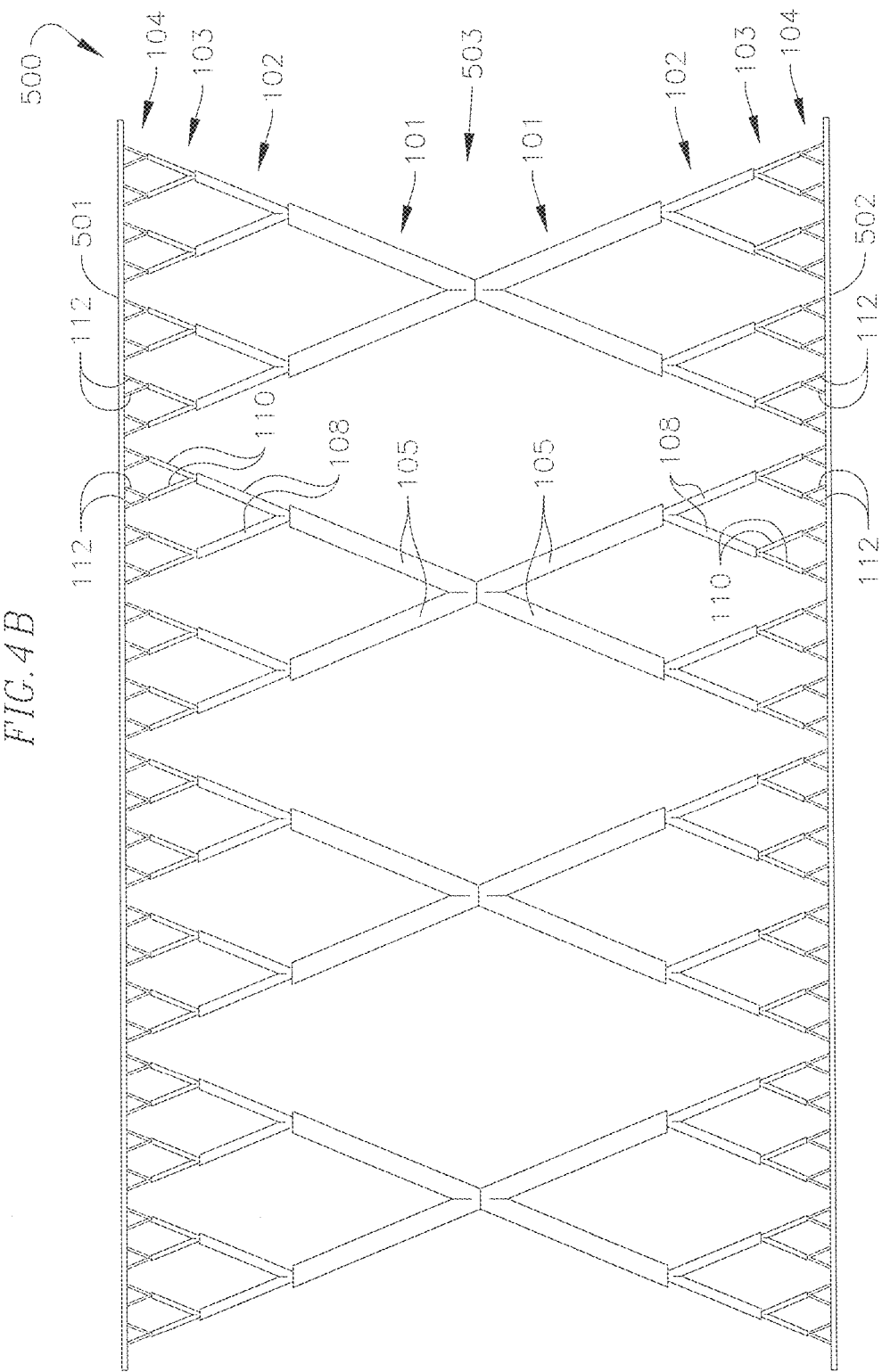

With reference now to FIGS. 4A and 4B, the branched hierarchical micro-truss structures 100, 200, 300 of the present disclosure may be incorporated into a sandwich structure. In the embodiment illustrated in FIG. 4A, a sandwich structure 400 includes an upper facesheet 401, a lower facesheet 402 spaced apart from the upper facesheet 401, and a reinforcing core 403 disposed between the upper and lower facesheets 401, 402, respectively. The reinforcing core 403 may be the same or similar to any one of the branched hierarchical micro-truss structures 100, 200, 300 described above with reference to FIGS. 1A-1C, 2A-2B, and 3A-3B, respectively, depending on the intended application of the sandwich structure 400 and the desired performance characteristics of the sandwich structure 400 (e.g., the buckling response, energy absorption properties, and load-bearing capacity of the reinforcing core 403). For instance, in the illustrated embodiment, the reinforcing core 403 is the same or similar to the branched hierarchical micro-truss structure 100 illustrated in FIGS. 1A-1C (i.e., the reinforcing core 403 includes four layers 101, 102, 103, 104 each having a plurality of struts 105, 108, 110, 112, respectively, arranged in an inverted square-based pyramid configuration). Additionally, in the embodiment illustrated in FIG. 4A, the lower facesheet 402 is coupled to the lower ends 106 (e.g., the nodes 107) of the struts 105 in the first layer 101 and the upper facesheet 401 is coupled to the struts 112 in the fourth layer 104 of the reinforcing core 403 (i.e., the branched hierarchical micro-truss structure). Because the fourth layer 104 includes eight times as many struts as the first layer 101, the upper facesheet 401 is supported at a greater number of points than a sandwich structure incorporating a conventional lattice core having a uniform arrangement of struts. Increasing the number of contact points between the branched hierarchical micro-truss structure 403 and the upper facesheet 401 (e.g., reducing or minimizing the unsupported area of the upper facesheet 401) is configured to increase the structural efficiency of the sandwich structure 400 in absorbing and transmitting mechanical loads. Although the upper and lower facesheets 401, 402 in the illustrated embodiment are flat, in one or more alternate embodiments, the upper facesheet 401 and/or lower facesheet 402 may be non-planar (e.g., the upper facesheet 401 and/or the lower facesheet 402 may be dome-shaped and/or may include compound out-of-plane curvature).

With reference now to the embodiment illustrated in FIG. 4B, a sandwich structure 500 according to another embodiment of the present disclosure includes an upper facesheet 501, a lower facesheet 502 spaced apart from the upper facesheet 501, and a reinforcing core 503 disposed between the upper and lower facesheets 501, 502, respectively. In the illustrated embodiment, the reinforcing core 503 is the same or similar to the reinforcing core 403 illustrated in FIG. 4A mirrored about a horizontal plane (i.e., the reinforcing core 503 is the same or similar to the branched hierarchical micro-truss structure 100 illustrated in FIGS. 1A-1C mirrored about a horizontal plane). Accordingly, in the illustrated embodiment, both the upper and lower facesheets 501, 502 are supported by the struts 112 in the fourth layers 104 of the branched hierarchical micro-truss structure. As described above, increasing the number of points supporting the facesheets (e.g., reducing or minimizing the unsupported area of the facesheets 501, 502) increases the efficiency of the sandwich structure 500 in absorbing and transmitting mechanical loads.

Figure 6:
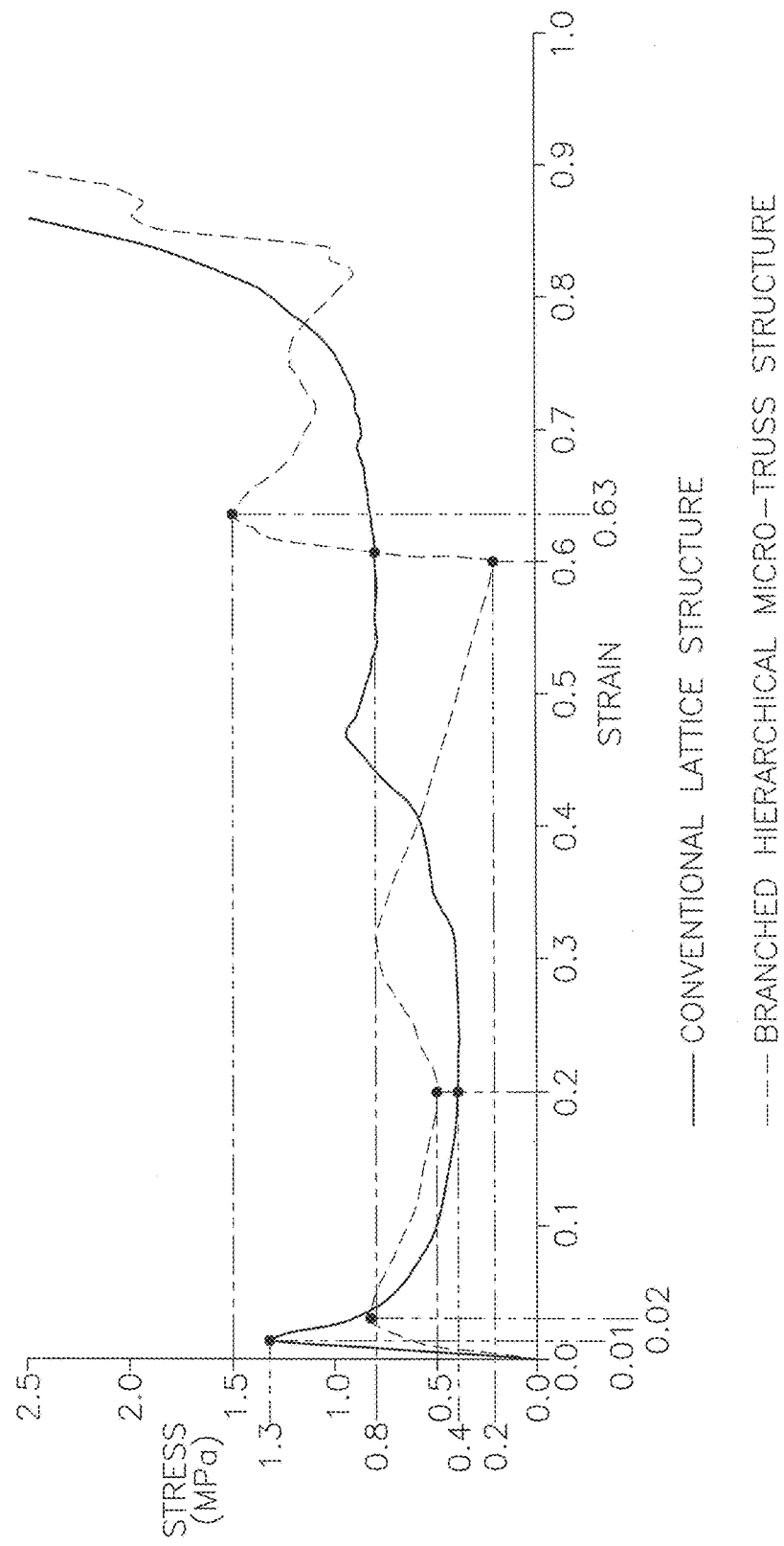
FIG. 6 is a graph comparing the stress-strain curve for a branched hierarchical micro-truss structure according to the present to a conventional lattice structure.

FIG. 6 illustrates the stress-strain curves of a branched hierarchical micro-truss structure of the present disclosure and a conventional lattice structure having a uniform arrangement of struts. In particular, FIG. 6 illustrates the stress-strain curve for a branched hierarchical micro-truss structure that is the same or similar to the branched hierarchical micro-truss structure 300 illustrated in FIGS. 3A and 3B, but without the reinforcing coating 311, 312 on the struts 307, 309 in the second and third layers 302, 303, respectively (i.e., a branched hierarchical micro-truss 300 with three layers 301, 302, 303 of struts 304, 307, 309 arranged in tetrahedral configurations). In one embodiment, the struts 309 in the third layer 303 of the branched hierarchical micro-truss structure 300 may be configured to lower the initial crushing stress required to buckle the third layer 303 (e.g., the diameter of the struts 309 in the third layer 303 may be smaller than the diameter of the struts 304, 307 in the first and second layers 301, 302). Lowering the initial crushing stress required to buckle the third layer 303 mitigates the large drop in crushing stress after buckling that is typically associated with a conventional lattice structure. For instance, as illustrated in FIG. 6, the conventional lattice structure drops from a stress of approximately or about 1.3 MPa at a strain of approximately or about 0.01 to a stress of approximately or about 0.4 MPa at a strain of approximately or about 0.2 after buckling. In contrast, in the illustrated embodiment, the branched hierarchical micro-truss structure 300 only drops from an initial crushing stress of approximately or about 0.8 MPa at a strain of approximately or about 0.02 to a stress of approximately or about 0.5 MPa at a strain of approximately or about 0.2 after buckling the third layer 303. The lower drop in stress experienced by the branched hierarchical micro-truss structure 300 is due to the relatively weaker struts 309 in the third layer 303 of the branched hierarchical micro-truss structure 300 that are configured to buckle before the struts 304, 307 in the first and second layers 301, 302 (i.e., the struts 309 in the third layer 303 are configured to buckle before the remainder of the branched hierarchical micro-truss structure 300 buckles). Accordingly, the branched hierarchical micro-truss structure 300 of the present disclosure is configured to buckle in a multi-stage manner, whereas the conventional lattice structure is configured to buckle in a single stage.

Additionally, the branched hierarchical micro-truss structure 300 of the present disclosure may be configured to exhibit higher crushing stress with increasing strain than the conventional lattice structure. For instance, in the illustrated embodiment, the stress exhibited by the branched hierarchical micro-truss structure 300 increases from approximately or about 0.2 MPa at a strain of approximately or about 0.6 to a stress of approximately or about 1.5 MPa at a strain of approximately or about 0.63, whereas the conventional lattice structure exhibits a substantially constant stress of approximately or about 0.8 MPa throughout this range. It will be appreciated that the physical properties of the branched hierarchical micro-truss structure (e.g., the number of layers, the size, shape, and orientation of the struts, and the materials of the struts) may be selected to tailor the buckling response of the branched hierarchical micro-truss structure based on the anticipated compressive loads acting on the branched hierarchical micro-truss structure.

Figure 7:
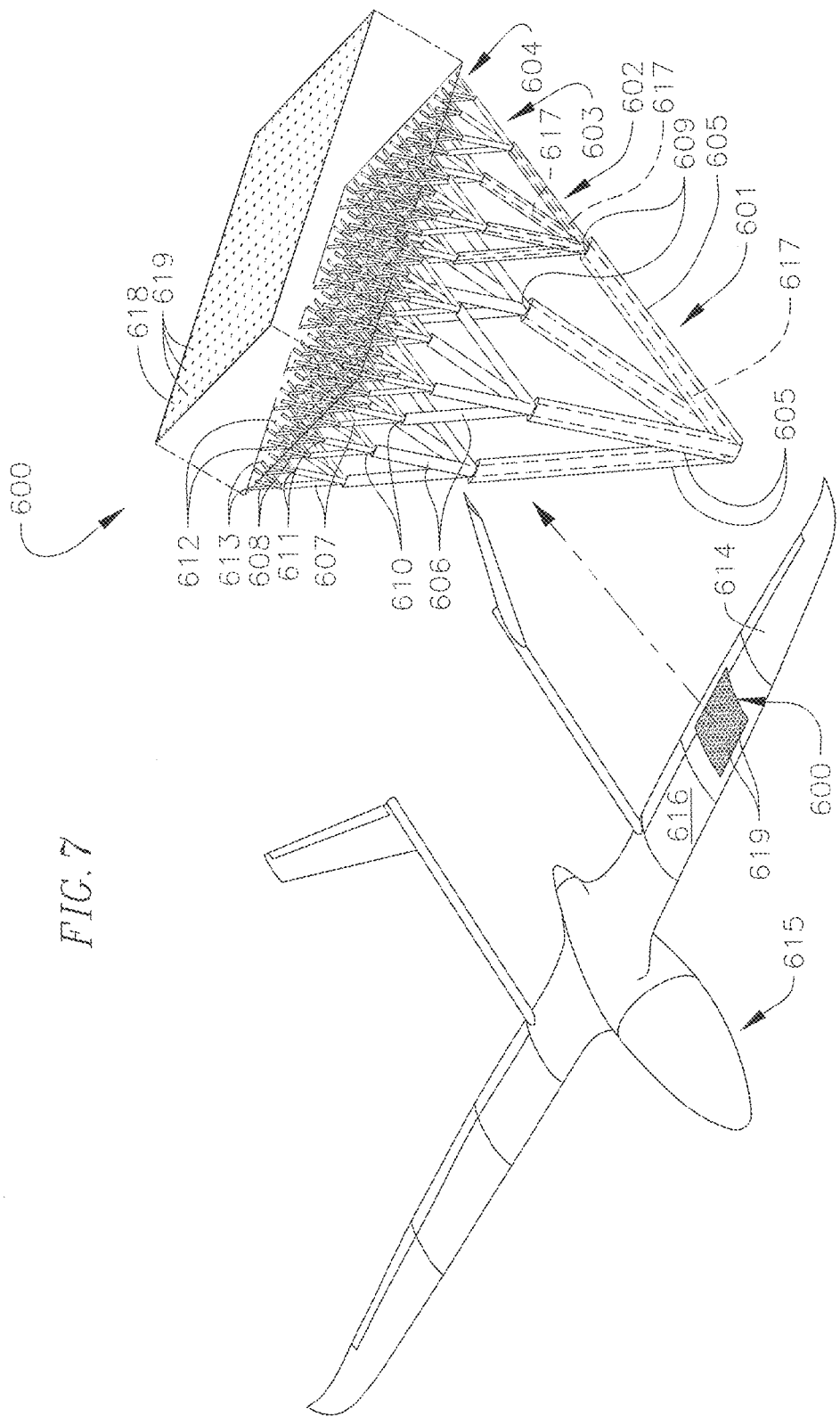
FIG. 7 is a perspective view of a branched hierarchical micro-truss structure according to one embodiment of the present disclosure configured to function as a fluid flow vascular system and incorporated into an aircraft to change aerodynamic properties of the aircraft and/or manage thermal loading on the aircraft.

With reference now to FIG. 7, a branched hierarchical micro-truss structure 600 according to another embodiment of the present disclosure includes four layers 601, 602, 603, 604 each having a plurality of interconnected hollow tubular struts 605, 606, 607, 608, although in one or more alternate embodiments, the branched hierarchical micro-truss structure 600 may include any other suitable number of layers 601, 602, 603, 604. In one embodiment, the branched hierarchical micro-truss structure 600 may be the same or similar to any one of the branched hierarchical micro-truss structures 100, 200, 300 described above with reference to FIGS. 1A-1C, 2A-2B, and 3A-3B, respectively, but with hollow tubular struts in fluid communication with each other rather than solid rods. In the illustrated embodiment, the first layer 601 of the branched hierarchical micro-truss structure 600 includes four hollow tubular struts 605 arranged in an inverted square-based pyramid configuration, the second layer 602 includes four hollow tubular struts 606 arranged in an inverted square-based pyramid configuration branching out from an upper end 609 of each of the struts 605 in the first layer 601, the third layer 603 includes four hollow tubular struts 607 arranged in an inverted square-based pyramid configuration branching out from an upper end 610 of each of the struts 606 in the second layer 602, and the fourth layer 604 includes four hollow tubular struts 608 arranged in an inverted square-based pyramid configuration branching out from an upper end 611 of each of the struts 607 in the third layer 603. In one or more alternate embodiments, the branched hierarchical micro-truss structure 600 may include any other suitable number of hollow tubular struts 605, 606, 607, 608 and the hollow tubular struts 605, 606, 607, 608 may be arranged in any other desired configuration suitable for the intended application of the branched hierarchical micro-truss structure 600.

With continued reference to the embodiment illustrated in FIG. 7, the hollow tubular struts 605 in the first layer 601 are in fluid communication with the hollow tubular struts 606, 607, 608 in the second, third, and fourth layers 602, 603, 604. Accordingly, because the hollow tubular struts 605, 606, 607, 608 are in fluid communication with each other, the branched hierarchical micro-truss structure 600 is configured to function as a vascular system for delivering a fluid (e.g., water). For instance, in one embodiment, openings 612 in upper ends 613 of the hollow tubular struts 608 in the fourth layer 604 may be exposed to an outer surface of a vehicle (e.g., an aircraft or an automobile) or other structure into which the branched hierarchical micro-truss structure 600 is incorporated (i.e., the openings 612 in the upper ends 613 of the hollow tubular struts 608 in the fourth layer 604 define a plurality of pores). For instance, in the embodiment illustrated in FIG. 7, the branched hierarchical micro-truss structure 600 is integrated into a wing 614 of an aircraft 615 and the openings 612 in the upper ends 613 of the hollow tubular struts 608 in the fourth layer 604 are exposed to an outer surface 616 of the wing 614 (i.e., the openings 612 in the upper ends 613 of the hollow tubular struts 608 in the fourth layer 604 define a plurality of pores in the outer surface 616 of the wing 614). Accordingly, a fluid 617 that readily evaporates may be pumped through the hollow tubular struts 605, 606, 607, 608 to provide transpirational cooling to the vehicle or other structure into which the branched hierarchical micro-truss structure 600 is incorporated (e.g., pumping a fluid through the hollow tubular struts 605, 606, 607, 608 that subsequently evaporates may provide cooling to the wing 614 of the aircraft 615 via the endothermic evaporation reaction and thickening of the boundary layer around the wing 614 by the evaporating gases). In the illustrated embodiment, the branched hierarchical micro-truss structure 600 also includes a skin or faceplate 618 coupled to the upper ends 613 of the hollow tubular struts 608 in the fourth layer 604. The skin 618 defines a plurality of openings 619 aligned with the openings 612 in the upper ends 613 of the hollow tubular struts 608 in the fourth layer 604. The skin 618 is configured to provide structural support to the hollow tubular struts 608 in the fourth layer 604. In one or more alternate embodiments, the branched hierarchical micro-truss structure 600 may be provided without the skin 618 (e.g., the skin 618 may be integrally formed in the vehicle or other structure into which the branched hierarchical micro-truss structure 600 is incorporated).

Figure 8A:
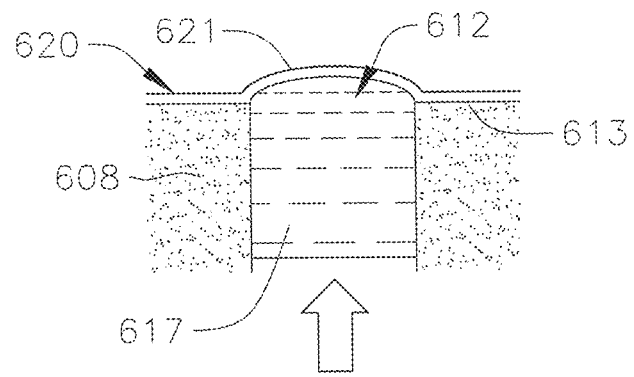
FIGS. 8A-8C illustrate fluid flow through the branched hierarchical micro-truss structure of FIG. 7 and the resultant formation of domed, flat, and dimpled surface morphology, respectively.
Figure 8B:
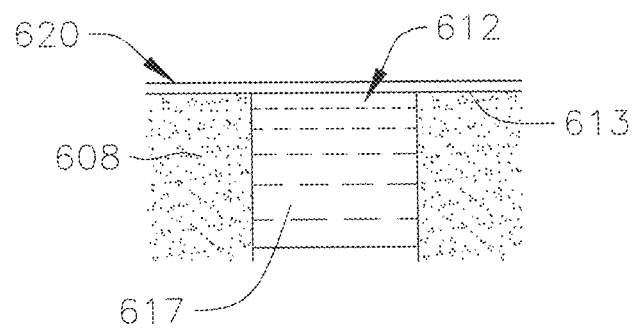
Figure 8C:
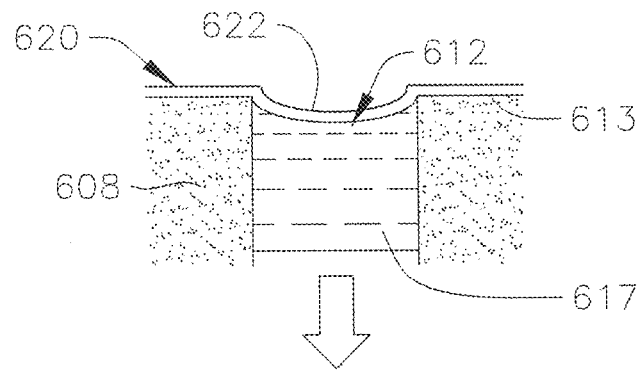

With reference now to the embodiment illustrated in FIGS. 8A-8C, the branched hierarchical micro-truss structure 600 may include a flexible membrane 620 coupled to the skin 618 and/or the upper ends 613 of the hollow tubular struts 608 in the fourth layer 604. The flexible membrane covers the openings 612 (i.e., the pores) in the upper ends 613 of the hollow tubular struts 608 in the fourth layer 604. As illustrated in FIG. 8A, the flexible membrane 620 is configured to deflect outward when a positive pressure is applied to the fluid 617 contained in the hollow tubular struts 608 of the branched hierarchical micro-truss structure 600. Accordingly, when a positive pressure is applied to the fluid 617 in the branched hierarchical micro-truss structure 600, such as from a pump, dome-shaped protrusions 621 are configured to form in the portions of the flexible membrane 620 covering the openings 612 in the upper ends 613 of the hollow tubular struts 608 in the fourth layer 604 (i.e., the flexible membrane 620 is configured to deflect outward into a plurality of dome-shaped protrusions 621 corresponding to the locations of the upper openings 612 in the hollow tubular struts 608 in the fourth layer 604 under the force of the pressurized fluid 617 in the branched hierarchical micro-truss structure 600). Additionally, as illustrated in FIG. 8C, the flexible membrane 620 is configured to deflect inward when a negative pressure is applied to the fluid 617 contained in the hollow tubular struts 608 in the branched hierarchical micro-truss structure 600. Accordingly, when a negative pressure is applied to the fluid 617, such as from a vacuum pump, in the branched hierarchical micro-truss structure 600, hemispherical dimples 622 are configured to form in the portions of the flexible membrane 620 covering the openings 612 in the upper ends 613 of the hollow tubular struts 608 in the fourth layer 604. As illustrated in FIG. 8B, the flexible membrane 620 is configured to return to a neutral, flat position when the fluid 617 contained in the hollow tubular struts 608 of the branched hierarchical micro-truss structure 600 is not pressurized (e.g., when the fluid 617 in the branched hierarchical micro-truss structure 600 is not pressurized, the flexible membrane 620 is configured to be flush with the contour of the outer surface of the vehicle or other structure into which the branched hierarchical micro-truss structure 600 is incorporated).

In an embodiment in which the branched hierarchical micro-truss structure 600 is incorporated into a vehicle (e.g., an automobile or the aircraft 615, as illustrated in FIG. 7), the fluid 617 contained in the hollow tubular struts 605, 606, 607, 608 may be pressurized to change the surface morphology of the vehicle. Changing the surface morphology of the vehicle into which the branched hierarchical micro-truss structure 600 is incorporated may change the aerodynamic properties of the vehicle (e.g., increase or decrease the aerodynamic drag of the aircraft). For instance, in an embodiment in which the branched hierarchical micro-truss structure 600 is incorporated into the wing 614 of an aircraft 615 (see FIG. 7), the dome-shaped protrusions 621 (FIG. 8A) and the hemispherical dimples 622 (FIG. 8C) in the flexible membrane 620 may function as vortex generators that induce the formation of a turbulent boundary layer covering the outer surface 616 of the wing 614 that tends to prevent or delay the onset of airflow separation from the wing 614 and the concomitant formation of low pressure vortices that would increase the overall drag on the aircraft 615. Changing the surface morphology of the vehicle may also be configured to increase the amount of heat that is transferred by convection. In this manner, the branched hierarchical micro-truss structure 600 may be configured to manage thermal loading on the vehicle or other structure into which the branched hierarchical micro-truss structure 600 is incorporated.

The diameters of the hollow tubular struts 605, 606, 607, 608 and the angles defined between the hollow tubular struts 605, 606, 607, 608 may be selected to minimize the pressure drop of the fluid 617 delivered through the branched hierarchical micro-truss structure 600 and thereby maximize the efficiency of the branched hierarchical micro-truss structure 600 at delivering the fluid 617. A person of ordinary skill in the art will appreciate that Murray's law, which, stated generally, is a formula that relates the radii of daughter branches to the radii of parent braches of a lumen-based system (e.g., the branching of a circulatory system, a respiratory system, or a water transport system in plants), may be used to optimize the configuration of the branched hierarchical micro-truss structure 600 (e.g., the diameter of the hollow tubular struts 605, 606, 607, 608 and the angles defined between the struts) for maximum fluid flow efficiency. Murray's law is described in Murray, Cecil D., "The Physiological Principle of Minimum Work: I. The Vascular System and the Cost of Blood Volume," Proceedings of the National Academy of Sciences of the United States of America (1926), 12 (3): 207-214 and Murray, Cecil D., "The Physiological Principle of Minimum Work: II. Oxygen Exchange in Capillaries," Proceedings of the National Academy of Sciences of the United States of America (1926), 12 (5): 299-304, the entire contents of both of which are incorporated herein by reference.

Figure 9A:
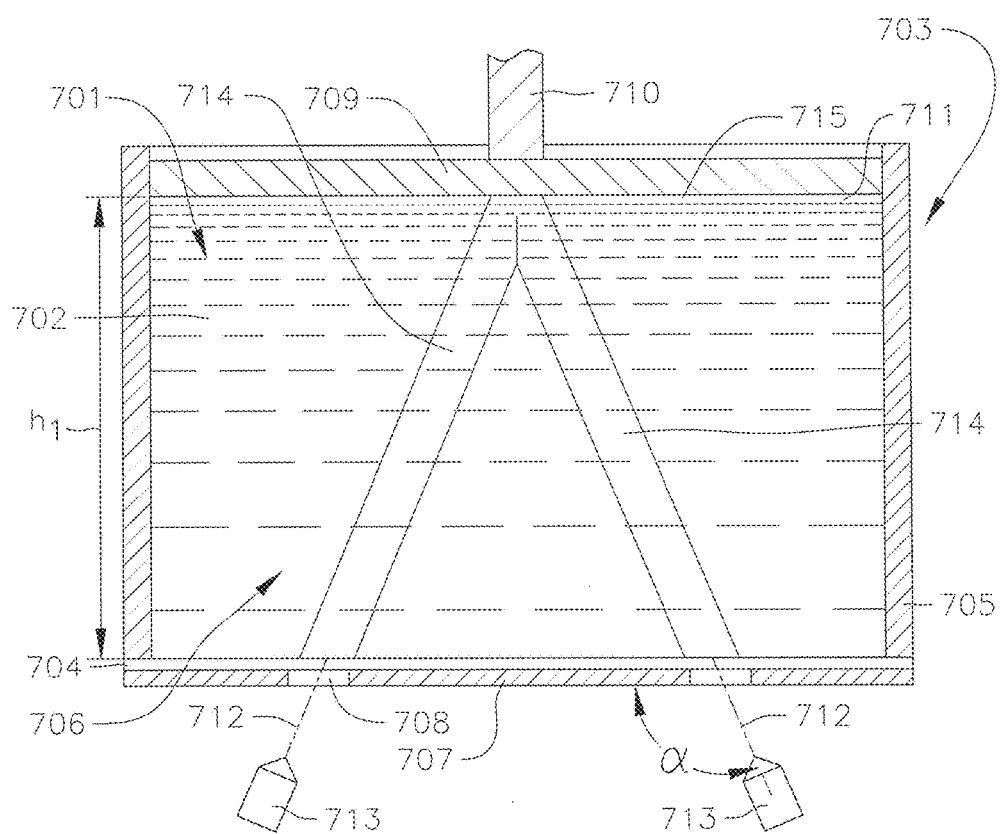
Figure 9B:
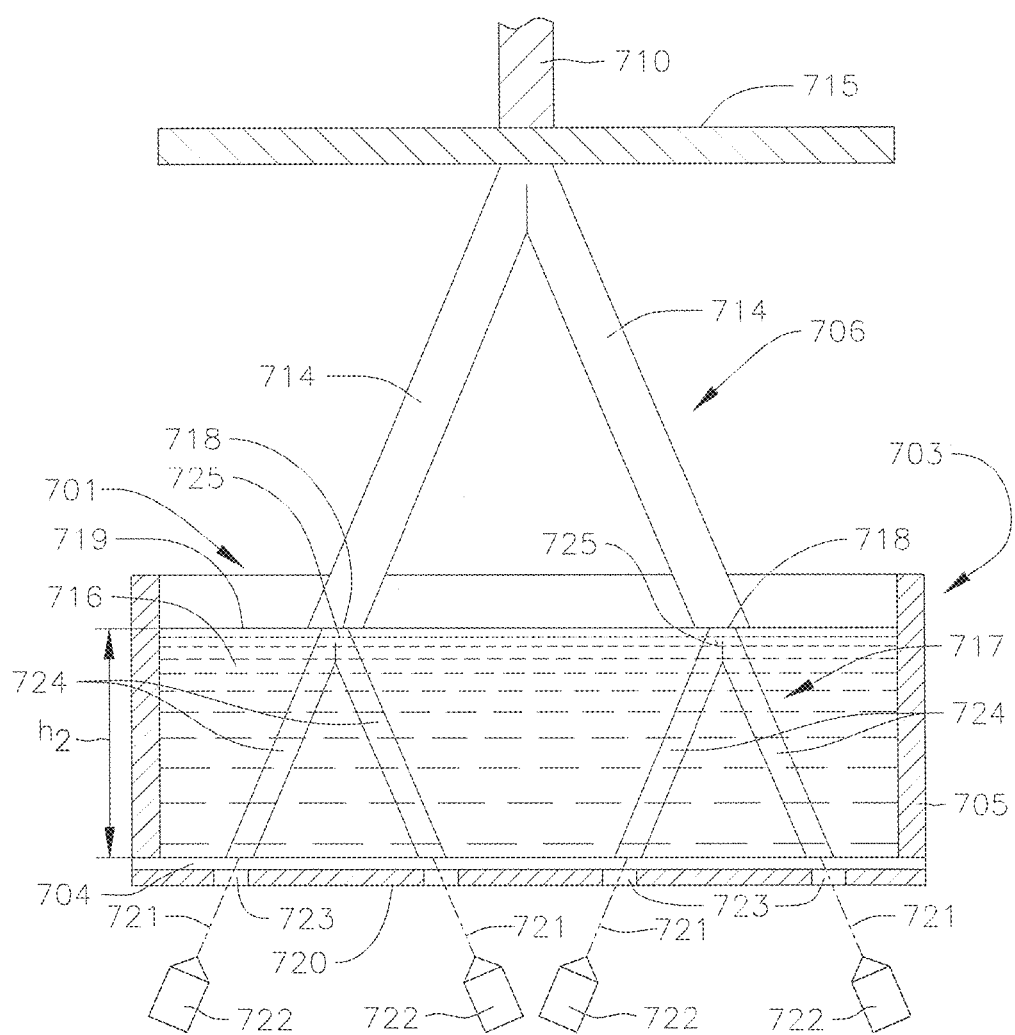

With reference now to FIGS. 9A-9C, a method of manufacturing the branched hierarchical micro-truss structures 100, 200, 300, 600 and the sandwich structures 400, 500 of the present disclosure will now be described. In the embodiment illustrated in FIG. 9A, the method includes a task of filling a reservoir 701 with a volume of liquid photo-monomer 702 that is configured to polymerize when exposed to light within a particular range of wavelengths, such as, for instance, ultraviolet light (i.e., wavelengths between 250 nm and 400 nm). The liquid photo-monomer 702 may be any suitable type or kind of monomer configured to polymerize when exposed to light, such as, for instance, urethanes (e.g., polyurethanes), acrylates, methacrylates, or cationic polymers (e.g., photo-cured epoxies). In the illustrated embodiment, the reservoir 701 is defined by a mold 703 having a translucent base 704 and vertical wall or rim 705 extending upward from a periphery of the base 704. The base 704 is translucent to those wavelengths of light that are configured to polymerize the liquid photo-monomer 702. The liquid photo-monomer 702 may be filled to any desired level within the reservoir 701, such as, for instance, from approximately or about 0.1 inch to approximately or about 1 inch above the base 704 of the mold 703, depending on the desired height of a first layer 706 of the branched hierarchical micro-truss structure.

With continued reference to FIG. 9A, the method also includes a task of covering the translucent base 704 of the mold 703 with a first mask 707. The first mask 707 defines a plurality of apertures 708. As described in more detail below, the first mask 707 may define any desired number of apertures 708 and the apertures 708 may have any desired size, shape, and spacing, depending upon the desired configuration of the first layer 706 of the branched hierarchical micro-truss structure. The first mask 707 may be made of any suitable material, such as, for instance, biaxially-oriented polyethylene terephthalate.

Still referring to the embodiment illustrated in FIG. 9A, the method also includes a task of lowering a substrate 709 attached to a moveable platform 710 until the substrate 709 abuts against an upper surface 711 of the volume of photo-monomer 702 in the reservoir 701. According to an alternate embodiment, the method may include a task of moving the substrate 709 into a suitable position based on the desired height of the first layer 706 and a task of injecting the liquid photo-monomer 702 into the reservoir 701 through a port in the mold 703 until the liquid photo-monomer 702 contacts the substrate 709.

With continued reference to FIG. 9A, the method also includes a task of irradiating the volume of liquid photo-monomer 702 in the reservoir 701 with a plurality of light beams 712 (e.g., collimated or substantially collimated ultraviolet light ("UV") beams) from one or more light sources 713. The task of irradiating the photo-monomer 702 includes directing the light beams 712 from the one or more light sources 713 up through the apertures 708 in the first mask 707 and through the translucent base 704 of the mold 703. The task of irradiating the photo-monomer 702 may also include directing the light beams 712 from the one or more light sources 713 off of one or more mirrors and up through the apertures 708 in the first mask 707. Regions of the liquid photo-monomer 702 that are exposed to the light beams 712 cure (i.e., polymerize). The polymerized regions propagate up through the volume of photo-monomer and form a plurality of polymer optical waveguides 714. The polymer optical waveguides 714 define the struts of the first layer 706 of the branched hierarchical micro-truss structure. Suitable methods for forming polymer optical waveguides are described in U.S. Pat. Nos. 7,653,279 and 7,382,959, the entire content of both of which are incorporated herein by reference.

The cross-sectional shape and size of the polymer optical waveguides 714 is a function of the shape and size of the light beams 712, which in turn are dependent upon the shape and size of the apertures 708 in the first mask 707. Accordingly, the first mask 707, and the shape and size of the apertures 708 defined therein, may be selected depending on the desired cross-sectional size and shape of the polymer optical waveguides 714 of the first layer 706, such as, for instance, circular, triangular, pentagonal, hexagonal, polygonal, oval, or star-shaped.

The direction in which the polymer optical waveguides 714 propagate through the volume of photo-monomer 702 is a function of the incident angles α at which the light beams 712 produced from the light sources 713 strike the volume of photo-monomer 702 in the reservoir 701. Accordingly, in one embodiment, the method includes positioning the one or more light sources 713 into the desired angular positions and directing the light beams 712 from the one or more light sources 713 into the photo-monomer 702 through the apertures 708 in the first mask 707 depending on the desired orientation and arrangement of the polymer optical waveguides 714 (i.e., the struts) in the first layer 706 of the branched hierarchical micro-truss structure. Additionally, the arrangement of the polymer optical waveguides 714 in the first layer 706 is a function of the positions of the apertures 708 in the first mask 707. For instance, in one embodiment, the positions of the apertures 708 in the first mask 707 may be selected, and the one or more light sources 713 and/or mirrors may be positioned, such that the polymer optical waveguides 714 in the first layer 706 are arranged in a square-base pyramid configuration (FIGS. 1A-1C), a square-based configuration with a central strut (FIGS. 2A-2B), a tetrahedral configuration (FIGS. 3A and 3B), or any other suitable configuration. In the illustrated embodiment, the first mask 707 defines four apertures 708 (only two of which are shown) arranged in a square pattern and the one or more light sources 713 and/or mirrors are positioned and oriented such that the polymer optical waveguides 714 in the first layer 706 are arranged in a square-base pyramid configuration.

Additionally, in one embodiment, the method may also include a task of varying the shape and/or size of the apertures 708 in the first mask 707 during the task of irradiating the photo-monomer 702 with the light beams 712. Varying the shape and/or size of the apertures 708 will produce polymer optical waveguides 714 that have a varying cross-sectional shape along their length and/or a varying cross-sectional size along their length. Further, in one embodiment, the method may include a task of varying the intensity of the light beams 712 to produce polymer optical waveguides 714 that taper along their length (e.g., the task may include increasing the intensity of the light beams 712 during the process of forming the first layer 706 of the branched hierarchical micro-truss structure). Increasing the intensity of the light beams 712 tends to cause the light beams 712 to diffuse or scatter further out into the photo-monomer 702. Accordingly, increasing the intensity of the light beams 712 during the task of irradiating the photo-monomer 702 is configured to produce a first layer 706 of the branched hierarchical micro-truss structure in which the portions of the polymer optical waveguides 714 proximate the upper end of the reservoir 703 (i.e., proximate the substrate 709) have a smaller cross-sectional size than the portions of the polymer optical waveguides 714 proximate a lower end of the reservoir 703 (i.e., proximate the first mask 707).

Additionally, the length to which the polymer optical waveguides 714 propagate through the volume of photo-monomer 702 in the reservoir 701 is a function of several factors, including the size, intensity, and exposure time of the incident light beams 712 and the light absorption/transmission properties of the liquid photo-monomer 702. Accordingly, in one embodiment, the method includes a task of selecting one or more light sources 713 configured to produce light beams 712 having a suitable intensity and exposing the volume of photo-monomer 702 in the reservoir 701 to the light beams 712 for a sufficient duration such that the polymer optical waveguides 714 propagate all the way up through the photo-monomer 702 and adhere to a lower surface 715 of the substrate 709.

With reference now the embodiment illustrated in FIG. 9B, the method also includes a task of actuating the moveable platform 710 to raise the substrate 709 until the first layer 706 of the branched hierarchical micro-truss structure is lifted out of a remaining volume of unpolymerized photo-monomer 716 in the reservoir 701 (i.e., the first layer 706 is lifted out of the volume of photo-monomer 716 that was not polymerized during the task of irradiating the volume of photo-monomer 702 to form the polymer optical waveguides 714 of the first layer 706). The method may also include a task of adding an additional volume of photo-monomer to the reservoir 701 of the mold 703 or removing a volume of photo-monomer from the reservoir 701 depending upon the desired thickness of a second layer 717 of the branched hierarchical micro-truss structure. In the illustrated embodiment, a volume of photo-monomer may be added or removed from the reservoir 701 such that the height $h_2$ of the photo-monomer 716 in the reservoir 701 is approximately half the height $h_1$ of the photo-monomer 702 during the task of forming the first layer 706 of the branched hierarchical micro-truss structure. In one or more alternate embodiments, the photo-monomer 716 in the reservoir 701 may be filled or lowered to any other suitable height $h_2$ (e.g., the height $h_2$ of the photo-monomer 716 in the reservoir 703 during the task of forming the second layer 717 may be greater than or substantially equal to the height $h_1$ of the photo-monomer 702 during the task of forming the first layer 706). The method also includes a task of actuating the moveable platform 710 to lower the substrate 715 and the first layer 706 of the branched hierarchical micro-truss structure until a lower end 718 of the first layer 706 contacts an upper surface 719 of the volume of photo-monomer 716 in the reservoir 701. The method also includes a task of removing the first mask 707 used during the task of forming the first layer 706 and replacing the first mask 707 with a second mask 720 having a different configuration than the first mask 707.

The method then includes a task of irradiating the volume of liquid photo-monomer 716 in the reservoir 701 with a plurality of light beams 721 (e.g., collimated or substantially collimated UV light beams) from one or more light sources 722 to form the second layer 717 of the branched hierarchical micro-truss structure. The task of irradiating the photo-monomer 716 includes directing the light beams 721 from the one or more light sources 722 up through apertures 723 defined in the second mask 720 and through the translucent base 704 of the mold 703. The task of irradiating the photo-monomer may also include directing the light beams 721 from the one or more light sources 722 off of one or more mirrors and up through the apertures 723 in the second mask 720 and through the translucent base 704 of the mold 703. Regions of the liquid photo-monomer 716 that are exposed to the light beams 721 cure (i.e., polymerize). The polymerized regions propagate up through the volume of photo-monomer 716 and form a plurality of polymer optical waveguides 724. The polymer optical waveguides 724 define the struts of the second layer 717 of the branched hierarchical micro-truss structure.

The method also includes a task of orienting and positioning the one or more light sources 722 and/or the one or more mirrors before irradiating the volume of photo-monomer 716 with a plurality of light beams 721 through the apertures 723 in the second mask 720 depending on the desired arrangement of the polymer optical waveguides 724 in the second layer 717. In one embodiment, the one or more light sources 722 and/or mirrors may be oriented and/or positioned differently than the one or more light sources 713 and/or mirrors used during the task of irradiating the photo-monomer 702 to form the first layer 706 of the branched hierarchical micro-truss structure. Additionally, in the illustrated embodiment, the one or more light sources 722 and/or mirrors are oriented and positioned such that upper ends 725 of the polymer optical waveguides 724 (i.e., the struts) of the second layer 717 adhere to the lower ends 718 of the polymer optical waveguides 714 (i.e., the struts) of the first layer 706 of the branched hierarchical micro-truss structure (i.e., the polymer optical waveguides 724 of the second layer 717 branch out from the end 718 of each the polymer optical waveguides 714 in the first layer 706).

The arrangement of the polymer optical waveguides 724 in the second layer 717 is also a function of the positions of the apertures 723 and the number of apertures 723 in the second mask 720. Accordingly, the positions of the apertures 723 and the number of apertures 723 in the second mask 720 may be selected such that the polymer optical waveguides 724 in the second layer 717 are arranged in a square-base pyramid configuration (see FIGS. 1A-1C), a square-based configuration with a central strut (see FIGS. 2A-2B), a tetrahedral configuration (see FIGS. 3A and 3B), or any other suitable configuration. In one or more embodiments, the orientation of the struts 724 in the second layer 717 of the branched hierarchical micro-truss structure may be the same or different than the orientation of the struts 714 in the first layer 706 of the branched hierarchical micro-truss structure. Additionally, in the embodiment illustrated in FIG. 9B, the second mask 720 has a greater number of apertures 723 than the first mask 707. Accordingly, in the illustrated embodiment, the method includes directing a greater number of light beams 721 through the second mask 720 during the task of forming the second layer 717 than through the first mask 707 during the task of forming the first layer 706 because the second mask 720 defines a greater number of apertures 723 than the first mask 707. Thus, the second layer 717 of the branched hierarchical micro-truss structure, formed by irradiating the photo-monomer 716 through the apertures 723 in the second mask 720, has a greater number of polymer optical waveguides 724 than the first layer 706. For instance, in one embodiment, the second layer 717 may have twice as many polymer optical waveguides as the first layer 706.

Additionally, the shape and/or size of the apertures 723 in the second mask 720 may differ from the apertures 708 in the first mask 707 depending on the desired characteristics of the polymer optical waveguides 724 in the second layer 717 of the branched hierarchical micro-truss structure. Accordingly, the size and/or cross-sectional shape of the polymer optical waveguides 724 in the second layer 717 may differ from the size and/or cross-sectional shape of the polymer optical waveguides 714 in the first layer 706 of the branched hierarchical micro-truss structure. In the illustrated embodiment, the apertures 723 in the second mask 720 are smaller than the apertures 708 defined in the first mask 707. For instance, in one embodiment, the shape and size of the apertures 723 in the second mask may be selected such that the diameter of the polymer optical waveguides 724 in the second layer 717 is approximately half the diameter of the polymer optical waveguides 714 in the first layer 706 of the branched hierarchical micro-truss structure. In one or more alternate embodiments, the size of the apertures 723 in the second mask 720 may be selected such that the polymer optical waveguides 724 in the second layer 717 have any other relative size compared to the polymer optical waveguides 714 in the first layer 706, such as, for instance, from approximately 5% to approximately 100% of the size of the polymer optical waveguides 714 in the first layer 706. Additionally, in one embodiment, the task of irradiating the photo-monomer 716 with the light beams 721 may also include varying the size and/or shape of the apertures 723 in the second mask 720 and/or varying the intensity of the light beams 721 to produce polymer optical waveguides 724 that have a varying cross-sectional shape and/or size along their length.

With reference now to the embodiment illustrated in FIG. 9C, the method also includes a task of actuating the moveable platform 710 to raise the substrate 709 until the second layer 717 of the branched hierarchical micro-truss structure is lifted out of a remaining volume of unpolymerized photo-monomer 726 in the reservoir 701. The method may also include a task of adding an additional volume of photo-monomer to the reservoir 701 of the mold 703 or removing a volume of photo-monomer from the reservoir 701 depending upon the desired thickness of a third layer 727 of the branched hierarchical micro-truss structure. In the illustrated embodiment, a volume of photo-monomer may be added or removed to the reservoir 701 such that the height $h_3$ of the photo-monomer 726 in the reservoir is approximately half the height $h_2$ of the photo-monomer 716 during the task of forming the second layer 717 of the branched hierarchical micro-truss structure, although in one or more alternate embodiments, the photo-monomer 726 in the reservoir 701 may be filled to any other suitable height $h_3$ (e.g., the height $h_3$ of the photo-monomer 726 in the reservoir 701 during the task of forming the third layer 727 may be greater than or approximately equal the height $h_2$ of the photo-monomer 716 during the task of forming the second layer 717). The method also includes a task of actuating the moveable platform 710 to lower the substrate 709 and the first and second layers 706, 717 of the branched hierarchical micro-truss structure until a lower end 728 of the second layer 717 contacts an upper surface 729 of the volume of photo-monomer 726 in the reservoir 701. The method also includes a task of removing the second mask 720 used during the task of forming the second layer 717 and replacing the second mask 720 with a third mask 730 having a different configuration than the second mask 720.

The method then includes a task of irradiating the volume of liquid photo-monomer 726 in the reservoir 701 with a plurality of light beams 731 (e.g., collimated or substantially collimated UV light beams) from one or more light sources 732 to form the third layer 727 of the branched hierarchical micro-truss structure. The task of irradiating the photo-monomer 726 includes directing the light beams 731 from the one or more light sources 732 up through apertures 733 defined in the third mask 730 and through the translucent base 704 of the mold 703. The task of irradiating the photo-monomer may also include directing the light beams 731 from the one or more light sources 732 off of one or more mirrors and up through the apertures 733 in the third mask 730 and through the translucent base 704 of the mold 703. Regions of the liquid photo-monomer 726 that are exposed to the light beams 721 cure (i.e., polymerize). The polymerized regions propagate up through the volume of photo-monomer 726 and form a plurality of polymer optical waveguides 734. The polymer optical waveguides 734 define the struts of the third layer 727 of the branched hierarchical micro-truss structure.

The method also includes a task of orienting and positioning the one or more light sources 732 and/or the one or more mirrors before irradiating the volume of photo-monomer 726 with a plurality of light beams 731 through the apertures 733 in the third mask 730 depending on the desired arrangement of the polymer optical waveguides 734 in the third layer 727. In one embodiment, the one or more light sources 732 and/or mirrors may be oriented and/or positioned differently than the light sources 713, 722 and/or mirrors used during the task of irradiating the photo-monomer 702, 716 to form the first and second layers 706, 717, respectively, of the branched hierarchical micro-truss structure. Additionally, in the illustrated embodiment, the one or more light sources 732 and/or mirrors are oriented and positioned such that upper ends 735 of the polymer optical waveguides 734 (i.e., the struts) of the third layer 727 adhere to the lower ends 728 of the polymer optical waveguides 724 (i.e., the struts) of the second layer 717 of the branched hierarchical micro-truss structure (i.e., the polymer optical waveguides 734 of the third layer 727 branch out from the end 728 of each the polymer optical waveguides 724 in the second layer 717).

The arrangement of the polymer optical waveguides 734 in the third layer 727 is also a function of the positions of the apertures 733 and the number of apertures 733 in the third mask 730. Accordingly, the positions of the apertures 733 and the number of apertures 733 in the third mask 730 may be selected such that the polymer optical waveguides 734 in the third layer 727 are arranged in a square-base pyramid configuration (see FIGS. 1A-1C), a square-based configuration with a central strut (see FIGS. 2A-2B), a tetrahedral configuration (see FIGS. 3A and 3B), or any other suitable configuration. In one or more embodiments, the orientation of the struts 734 in the third layer 727 of the branched hierarchical micro-truss structure may be the same or different than the orientation of the struts 714, 724 in the first layer 706 and/or the second layer 717 of the branched hierarchical micro-truss structure. Additionally, in the embodiment illustrated in FIG. 9C, the third mask 730 has a greater number of apertures 733 than the second mask 720. Accordingly, in the illustrated embodiment, the method includes directing a greater number of light beams 731 through the third mask 730 during the task of forming the third layer 727 than through the second mask 720 during the task of forming the second layer 717 because the third mask 730 defines a greater number of apertures 733 than the second mask 720. Thus, the third layer 730 of the branched hierarchical micro-truss structure, formed by irradiating the photo-monomer 726 through the apertures 733 in the third mask 730, has a greater number of polymer optical waveguides 734 than the second layer 717. For instance, in one embodiment, the third layer 727 may have twice as many polymer optical waveguides as the second layer 717 and four times as many polymer optical waveguides as the first layer 706.

Additionally, the shape and/or size of the apertures 733 in the third mask 730 may differ from the apertures 708, 723 in the first mask 707 and/or the second mask 720 depending on the desired characteristics of the polymer optical waveguides 734 in the third layer 727 of the branched hierarchical micro-truss structure. Accordingly, the size and/or cross-sectional shape of the polymer optical waveguides 734 in the third layer 727 may differ from the size and/or cross-sectional shape of the polymer optical waveguides 714, 724 in the first layer 706 and/or the second layer 717 of the branched hierarchical micro-truss structure. In the illustrated embodiment, the apertures 733 in the third mask 730 are smaller than the apertures 723 defined in the second mask 720. For instance, in one embodiment, the shape and size of the apertures 733 in the third mask 730 may be selected such that the diameter of the polymer optical waveguides 734 in the third layer 727 is approximately half the diameter of the polymer optical waveguides 724 in the second layer 717 of the branched hierarchical micro-truss structure. In one or more alternate embodiments, the size of the apertures 733 in the third mask 730 may be selected such that the polymer optical waveguides 734 in the third layer 727 have any other relative size compared to the polymer optical waveguides 724 in the second layer 717, such as, for instance, from approximately 5% to approximately 100% of the size of the polymer optical waveguides 724 in the second layer 717. Additionally, in one embodiment, the task of irradiating the photo-monomer 726 with the light beams 731 may also include varying the size and/or shape of the apertures 733 in the third mask 730 and/or varying the intensity of the light beams 731 to produce polymer optical waveguides 734 that have a varying cross-sectional shape and/or size along their length.

Suitable methods for manufacturing stacked microlattice structures are also described in U.S. patent application Ser. No. 14/461,841, entitled "Stacked Microlattice Materials and Fabrication Processes," filed on Aug. 18, 2014, the entire content of which is incorporated herein by reference.

Although the above-described tasks describe the formation of a branched hierarchical micro-truss structure having three layers 706, 717, 727, the above-described tasks may be performed to form a branched hierarchical micro-truss structure having any other suitable number of layers, such as, for instance, from two to eight layers. In particular, the above-described tasks of filling a reservoir with a liquid photo-monomer, irradiating the photo-monomer with a plurality of light beams through apertures in a first mask to form a first layer, actuating a moveable platform to lift the first layer out of the volume of unused photo-monomer in the reservoir, and irradiating a second volume of photo-monomer with a plurality of light beams through apertures in a second mask to form a second layer may be repeated any suitable number of times to form a branched hierarchical micro-truss structure having any desired number of layers suitable for the intended application of the branched hierarchical micro-truss structure.

Additionally, in one or more embodiments, the method may include a task of depositing a material, such as, for instance, metal (e.g., nickel, aluminum), metal alloy (e.g., nickel-phosphorous alloy), ceramic, polymer (e.g., poly(p-xylylene)), or any combination thereof, onto one or more of the polymer optical waveguides (i.e., struts) 714, 724, 734. The material may be deposited onto the polymer optical waveguides 714, 724, 734 by any suitable process, such as, for instance, electrodeposition, electroplating, vapor deposition (e.g., chemical vapor deposition (CVD)), spray coating, dip coating, or any combination thereof. The material may be selectively deposited onto regions of the branched hierarchical micro-truss structure that require structural reinforcement. For instance, the material may be deposited only onto particular polymer optical waveguides 714, 724, 734, or portions thereof, that are expected to experience mechanical loads exceeding a threshold value. For instance, the material may be deposited only onto the struts 734, 724 in the second and third layers 717, 727, respectively, that are axially aligned with the struts 714 in the first layer 706, as in the embodiment of the branched hierarchical micro-truss structure 300 illustrated in FIGS. 3A and 3B. Suitable methods for selectively plating regions of a micro-truss structure are described in U.S. Pat. No. 9,738,013, entitled "Multi-Chemistry Microlattice Structures and Methods of Manufacturing the Same", issued on Aug. 22, 2017, the entire content of which is incorporated herein by reference.

In another embodiment, the method may include a task of completely covering the polymer optical waveguides 714, 724, 734 with the material and then a task of selectively removing the polymer optical waveguides 714, 724, 734 by any suitable process, such as, for instance, chemical etching, to form a plurality of interconnected hollow tubular struts formed out of the material previously deposited onto the polymer optical waveguides 714, 724, 734. Removing the polymer optical waveguides 714, 724, 734 to form interconnected hollow tubular struts allows the branched hierarchical micro-truss structure to function as a vascular system for delivering a fluid, as described above with reference to FIGS. 7 and 8A-8C. It will be appreciated that the shape and size of the inner openings of the hollow tubular struts will match or substantially match the shape and size of the polymer optical waveguides 714, 724, 734 that were removed (e.g., the inner diameters of the openings in the hollow tubular struts will match or substantially match the outer diameters of the polymer optical waveguides 714, 724, 734 that were removed). Additionally, in one or more embodiments, the method may include a task of using the branched hierarchical micro-truss structure as a template to form a mold (e.g., an investment casting) with which branched hierarchical micro-truss structures may be manufactured out of any suitable material (e.g., aluminum). Additionally, in one or more embodiments, the method may include a task of coupling one or more facesheets to the branched hierarchical micro-truss structure to form a sandwich structure, as illustrated, for example, in FIGS. 4A and 4B.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims. Although relative terms such as "outer," "inner," "upper," "lower," and similar terms have been used herein to describe a spatial relationship of one element to another, it is understood that these terms are intended to encompass different orientations of the various elements and components of the invention in addition to the orientation depicted in the figures. Additionally, as used herein, the term "substantially," "about," and similar terms are used as terms of approximation and not as terms of degree, and are intended to account for the inherent deviations in measured or calculated values that would be recognized by those of ordinary skill in the art. Moreover, the tasks described above may be performed in the order described or in any other suitable sequence. Additionally, the methods described above are not limited to the tasks described. Instead, for each embodiment, one or more of the tasks described above may be absent and/or additional tasks may be performed. Furthermore, as used herein, when a component is referred to as being "on" another component, it can be directly on the other component or components may also be present therebetween. Moreover, when a component is component is referred to as being "coupled" to another component, it can be directly attached to the other component or intervening components may be present therebetween.

What is claimed is:

1. A method of manufacturing a branched hierarchical micro-truss structure, the method comprising:
    irradiating a first volume of photo-monomer in a reservoir with a first plurality of light beams by directing the first plurality of light beams through a plurality of apertures defined by a first mask to form a first layer of the branched hierarchical micro-truss structure having a plurality of polymer optical waveguides coupled to a substrate;
    actuating a moveable platform coupled to the substrate to lift the first layer of the branched hierarchical micro-truss structure out of a remaining volume of photo-monomer; and
    irradiating a second volume of photo-monomer with a second plurality of light beams by directing the second plurality of light beams through a plurality of apertures defined by a second mask to form a second layer of the branched hierarchical micro-truss structure having a plurality of polymer optical waveguides, wherein the plurality of polymer optical waveguides of one of the first and second layers branch outward from the plurality of polymer optical waveguides of the other one of the first and second layers, and wherein the plurality of apertures in the second mask is greater in number than that of the plurality of apertures in the first mask.

2. The method of claim 1, further comprising adding or removing a volume of photo-monomer to the reservoir after the irradiating of the first volume of photo-monomer with the first plurality of light beams to form the first layer of the micro-truss structure.

3. The method of claim 1, wherein the plurality of apertures defined by the second mask differ in at least one of size, shape, and spacing from the apertures defined by the first mask.

4. The method of claim 1, wherein a height of the first volume of photo-monomer is greater than a height of the second volume of photo-monomer.

5. The method of claim 1, further comprising:
actuating the moveable platform to lift the first and second layers of the micro-truss structure out of a remaining volume of the photo-monomer; and
orienting a third plurality of light beams and irradiating a third volume of photo-monomer with the third plurality of light beams to form a third layer of the micro-truss structure having a plurality of polymer optical waveguides branching outward from ends of each of a plurality of the polymer optical waveguides in the second layer.

6. The method of claim 1, further comprising coating at least a portion of the polymer optical waveguides in the first or second layer with a dissimilar material by a process selected from the group of processes consisting of electrodeposition, electroplating, vapor deposition, spray coating, dip coating, and combinations thereof.

7. The method of claim 6, wherein the dissimilar material is coated on a polymer optical waveguide in the first layer axially aligned with a polymer optical waveguide in the second layer.

8. The method of claim 1, further comprising:
depositing a material to completely cover the polymer optical waveguides in the first and second layers; and
selectively removing the polymer optical waveguides to form a plurality of interconnected hollow tubular struts formed out of the material deposited onto the polymer optical waveguides.

9. The method of claim 1, further comprising positioning and orienting the first plurality of light beams such that the polymer optical waveguides in the first layer are arranged in a square-based pyramid configuration or a tetrahedral configuration.

10. A branched hierarchical micro-truss structure, comprising:
a first layer comprising a plurality of interconnected struts; and
a second layer comprising a plurality of struts branching outward from an end of each of a plurality of the struts in the first layer, each strut in the second layer having a first end at the end of one of the struts in the first layer and a second end opposite the first end,
wherein the struts in the first and second layers are hollow tubes,
wherein a first group of struts in the second layer is separated from a second group of struts in the second layer adjacent to the first group of struts, the first group of struts in the second layer branching out from one of the plurality of struts in the first layer and the second group of struts in the second layer branching out from another one of the plurality of struts in the first layer, and
wherein the second ends of the first group of struts in the second layer are not directly connected to the second ends of the second group of struts in the second layer.

11. A vascular system, comprising:
a plurality of layers;
a first layer of the plurality of layers comprising a plurality of hollow tubular struts;
a second layer of the plurality of layers comprising a plurality of hollow tubular struts branching out from an end of each of a plurality of struts in the first layer, wherein the hollow tubular struts in the second layer are in fluid communication with the hollow tubular struts in the first layer;
a fluid contained in the plurality of hollow tubular struts in the first and second layers; and
a flexible membrane coupled to ends of a plurality of hollow tubular struts in an outermost layer of the plurality of layers, wherein the flexible membrane is configured to form dome-shaped protrusions when a positive pressure is applied to the fluid and hemispherical dimples when a negative pressure is applied to the fluid.

12. The vascular system of claim 11, wherein:
the plurality of hollow tubular struts in the first layer are arranged in a square-based pyramid configuration or a tetrahedral configuration; and
the plurality of hollow tubular struts in the second layer are arranged in a square-based pyramid configuration or a tetrahedral configuration.

13. A vascular system, comprising:
a plurality of layers, comprising:
a first layer comprising a plurality of hollow tubular struts; and
a second layer comprising a plurality of hollow tubular struts branching out from an end of each of a plurality of struts in the first layer, each hollow tubular strut in the second layer having a first end at the end of one of the hollow tubular struts in the first layer and a second end opposite the first end,
wherein the hollow tubular struts in the second layer are in fluid communication with the hollow tubular struts in the first layer,
wherein a number of hollow tubular struts in the second layer is greater than a number of hollow tubular struts in the first layer,
wherein a first group of hollow tubular struts in the second layer is separated from a second group of hollow tubular struts in the second layer adjacent to the first group, the first group of hollow tubular struts in the second layer branching out from one of the plurality of hollow tubular struts in the first layer and the second group of hollow tubular struts in the second layer branching out from another one of the plurality of hollow tubular struts in the first layer, and
wherein the second ends of the first group of hollow tubular struts in the second layer are not directly connected to the second ends of the second group of hollow tubular struts in the second layer; and
a faceplate coupled to a plurality of hollow tubular struts in an outermost layer of the plurality of layers, the faceplate defining a plurality of openings aligned with a plurality of openings defined by the plurality of hollow tubular struts in the outermost layer such that a fluid can be delivered through the plurality of openings defined by the faceplate.

14. The vascular system of claim 11, further comprising a third layer comprising a plurality of hollow tubular struts branching out from an end of each of a plurality of hollow tubular struts in the second layer, wherein the hollow tubular struts in the third layer are in fluid communication with the hollow tubular struts in the second layer.

15. The vascular system of claim 11, wherein the plurality of hollow tubular struts in each of the first layer and the second layer are polymer optical waveguides.

16. The vascular system of claim 13, further comprising a third layer of the plurality of layers, the third layer comprising a plurality of hollow tubular struts branching out from the second end of each of a plurality of hollow tubular struts in the second layer, wherein the hollow tubular struts in the third layer are in fluid communication with the hollow tubular struts in the second layer.

17. The vascular system of claim 13, wherein the plurality of hollow tubular struts in each of the first layer and the second layer are polymer optical waveguides.

\* \* \* \* \*